(12) United States Patent
Bulucea

(10) Patent No.: US 6,576,966 B1
(45) Date of Patent: Jun. 10, 2003

(54) FIELD-EFFECT TRANSISTOR HAVING MULTI-PART CHANNEL

(75) Inventor: Constantin Bulucea, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/535,434

(22) Filed: Mar. 23, 2000

Related U.S. Application Data

(63) Continuation of application No. 08/893,628, filed on Jul. 11, 1997, now Pat. No. 6,078,082, which is a continuation of application No. 08/420,927, filed on Apr. 12, 1995, now abandoned.

(51) Int. Cl.[7] .............................................. H01L 29/76
(52) U.S. Cl. ...................................... 257/408; 257/345
(58) Field of Search ................................ 257/408, 344, 257/345, 369, 402, 336, 655; 438/286

(56) References Cited

U.S. PATENT DOCUMENTS

| 3,673,471 A | 6/1972 | Klein et al. ................. 438/585 |
| 3,883,372 A | 5/1975 | Lin ............................. 438/286 |
| 3,919,008 A | 11/1975 | Iwamatsu .................... 257/369 |

(List continued on next page.)

FOREIGN PATENT DOCUMENTS

| EP | 0083447 | 7/1983 |
| EP | 0198335 | 10/1986 |
| EP | 0595484 | 5/1994 |
| JP | 53-66181 | 6/1978 |
| JP | 60-137066 | 7/1985 |
| JP | 61-276252 | 4/1987 |
| JP | 62-095863 | 10/1987 |
| JP | 62-281462 | 5/1988 |
| JP | 63-275179 | 11/1988 |
| WO | WO 90/07794 | 7/1990 |

OTHER PUBLICATIONS

Armijos, "High–Speed DMOS FET Analog Switches and Switch Arrays", *Siliconix, Temic, AN301, Low Power Discretes*, vol. 12, Jun, 22, 1994 pp. 33–42.
Bulucea, "Avalanche Injection into the Oxide in Silicon Gate–Controlled Devices—I. Theory", *Solid–State Electronics*, vol. 18, 1975, pp. 363–374.
Bulucea, "Avalanche Injection into the Oxide in Silicon Gate–Controlled Devices—II. Experimental Results", *Solid–State Electronics*, vol. 18, 1975, pp.381–391.
Bulucea et al., "Surface Breakdown in Silicon Planar Junction—A Computer–Aided Experimental Determination of the Critical Field", *Solid–State Electronics*, vol. 17, 1974, pp. 881–888.

(List continued on next page.)

*Primary Examiner*—Mark V. Prenty
(74) *Attorney, Agent, or Firm*—Skjerven Morrill LLP; Ronald J. Meetin

(57) ABSTRACT

An asymmetric insulated-gate field-effect transistor (40) is configured in an asymmetric lightly doped drain structure that alleviates hot-carrier effects and enables the source characteristics to be decoupled from the drain characteristics. The transistor has a multi-part channel formed with an output portion (46), which adjoins the drain zone, and a more heavily doped input portion (42), which adjoins the source zone (44). The drain zone contains a main portion (52) and a more lightly doped extension (50) that meets the output channel portion. The drain extension extends at least as far below the upper semiconductor surface as the main drain portion so as to help reduce hot-carrier effects. The input channel portion is situated in a threshold body zone (53) whose doping determines the threshold voltage. The provision of a lightly doped source extension is avoided so that improving the drain characteristics does not harm the source characteristics, and vice versa.

30 Claims, 15 Drawing Sheets

U.S. PATENT DOCUMENTS

| | | | |
|---|---|---|---|
| 4,028,717 A | 6/1977 | Joy et al. | 257/404 |
| 4,280,855 A | 7/1981 | Bertin et al. | 148/1.5 |
| 4,282,648 A | 8/1981 | Yu et al. | |
| 4,442,589 A | 4/1984 | Doo et al. | |
| 4,929,991 A | 5/1990 | Blanchard | |
| 4,950,617 A | 8/1990 | Kumagai et al. | 438/286 |
| H986 H | 11/1991 | Codella et al. | 357/344 |
| 5,072,267 A | 12/1991 | Hattori | |
| 5,155,563 A | 10/1992 | Davies et al. | |
| 5,216,272 A | 6/1993 | Kubokoya et al. | 257/409 |
| 5,237,193 A | 8/1993 | Williams et al. | 257/344 |
| 5,296,393 A | 3/1994 | Smayling et al. | |
| 5,306,656 A | 4/1994 | Williams et al. | |
| 5,364,807 A | 11/1994 | Hwang | 438/305 |
| 5,371,394 A | 12/1994 | Ma et al. | 257/335 |
| 5,395,772 A * | 3/1995 | Miyazawa et al. | 257/347 |
| 5,424,229 A | 6/1995 | Oyamatsu | 438/286 |
| 5,427,963 A * | 6/1995 | Richart et al. | 438/286 |
| 5,427,964 A | 6/1995 | Kaneshiro et al. | |
| 5,441,906 A | 8/1995 | Burger | |
| 5,451,807 A | 9/1995 | Fujita | 257/404 |
| 5,482,878 A | 1/1996 | Burger et al. | |
| 5,517,049 A | 5/1996 | Huang | |
| 5,565,369 A * | 10/1996 | Ko | 438/286 |
| 5,691,560 A | 11/1997 | Sakakibara | 257/408 |
| 5,744,372 A | 4/1998 | Bulucea | 438/231 |
| 5,780,912 A | 7/1998 | Burr et al. | 257/344 |
| 6,078,082 A * | 6/2000 | Bulucea | 257/345 |
| 6,278,162 B1 | 8/2001 | Lien et al. | 257/408 |

OTHER PUBLICATIONS

Bulucea et al., "Trench DMOS Transistor Technology for High–Current (100 A Range) Switching", *Solid–State Electronics*, vol. 34, 1991, pp. 493–507.

Buti et al., "A New Asymmetrical Halo Source GOLD Drain (HS–GOLD) Deep Sub–Half–Micrometer n–MOSFET Design Reliability and Performance", *IEEE Trans. Electron Dev.*, Aug. 1991, pp. 1751–1764.

Chakravarti et al, "Double–Diffused Metal–Oxide Silicon FET," *IBM Tech. Discl. Bull.*, Sep. 1976, pp. 1162–1163.

Chang et al., "A High–Performance 0.25 mm CMOS Technology: I—Design and Characterization", *IEEE Transactions on Electron Devices*, vol. 39, Apr. 1992, pp. 959–966.

Cottrell et al, "Hot–Electron Emission in N–channel IGFETs", *IEEE Transactions on Electron Devices*, vol. ED–26, 1979, pp. 520–533.

Davari et al, "A High–Performance 0.25–mm CMOS Technology: II–Technology", *IEEE Transactions on Electron Devices*, vol. 39, Apr. 1992, pp. 967–975.

Declercq et al., "Design and Optimization of High–Voltage CMOS Devices Compatible With A Standard 5 V CMOS Technology", *Proc., IEEE Custom Integrated Circuits Conference*, 1993, pp. 24.6–24.6.4.

El–Kareh et al, *Introduction to VLSI Silicon Devices* (Kluwer Academic), Chapter 6, 1986, pp. 408–485, 548–557.

Fair, "Challenges to Manufacturing Submicron, Ultra–Large Scale Integrated Circuits", *Proceedings of the IEEE*, vol. 78, No. 11, Nov. 1990, pp. 1687–1705.

Grove, et al, "Effect of Surface Fields on the Breakdown Voltage of Planar Silicon p–n Junctions", *IEEE Transactions on Electron Devices*, vol. ED–14, Mar. 1967, pp. 157–162.

Grove, *Physics and Technology of Semiconductor Devices* (John Wiley & Sons), Section 6.7, 1967, pp. 191–201.

Koyanagi et al, "Optimum Design of n+n–Double–Diffused Drain MOSFET to Reduce Hot–Carrier Emission", *IEEE Transactions on Electron Devices*, vol. ED–32, No. 3, Mar. 1985, pp. 562–570.

Meyer et al, "Integrable High Voltage CMOS: Devices, Process Application", *IEDM Technical Digest*, 1980, pp. 732–735.

Muller et al, *Device Electronics for Integrated Circuits* (John Wiley & Sons), Chapter 8, 1986, pp. 378–421.

Ning, "Hot–Electron Emission From Silicon Into Silicon Dioxide", *Solid–State Electronics*, vol. 21, 1978, pp. 157–162.

Ogura et al, "Design and Characteristics of the Lightly Doped Drain–Source (LDD) Insulator Gate Field–Effect Transistor", *IEEE Transactions on Electron Devices*, vol. ED–27, 1980, pp. 1359–1367.

Ogura et al, "Elimination of Hot Electron Gate Current by the Lightly Doped Drain–Source Structure", *IEDM Technical Digest*, 1981, pp. 651–654.

Oxner, "DMOS Satisfies, JFET, CMOS, GaAs FET Performance Needs", *Microwaves & RF* Aug. 1987, pp. 133–136.

Parrillo et al, "Twin–Tub CMOS—A Technology For VLSI Circuits", *IEDM Technical Digest*, 1980, pp. 752–755.

Sanchez et al, "Drain–Engineered Hot–Electron–Resistant Device Structures: A Review", *IEEE Transactions on Electron Devices*, vol. 36, 1989, pp. 1125–1132.

Sze, *VLSI Technology* (2d ed., McGraw–Hill Book Co.), Section 11.4, 1988, pp. 490–493.

Takeda et al, "An As–P(n+n–) Double Diffused Drain MOS-FET for VLSIs", *IEEE Transactions on Electron Devices*, Jun. 1983, vol. ED–30, pp. 652–657.

Tsang et al, "Fabrication of High–Performance LDDFET's with Oxide Sidewall–Spacer Technology", *IEEE Transactions on Electron Devices*, vol. ED–29, No. 4, Apr. 1982, pp. 590–596.

Williams et al, "D/CMOS Processes for Analogue Multiplexers", *New Electronics*, Jun. 9, 1987, pp. 24–25.

Wolf, *Silicon Processing for the VLSI Era, vol. II: Process Integration* (Lattice Press), 1990, pp. 356–359.

"An Introduction to FETs", *Temic, AN101, Low–Power Discretes*, Siliconix, vol. 12, Jul. 11, 1994, pp. 12–1–12–5.

* cited by examiner

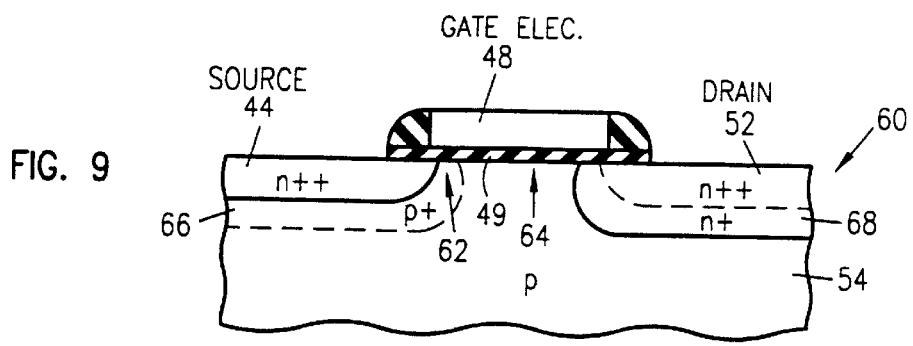
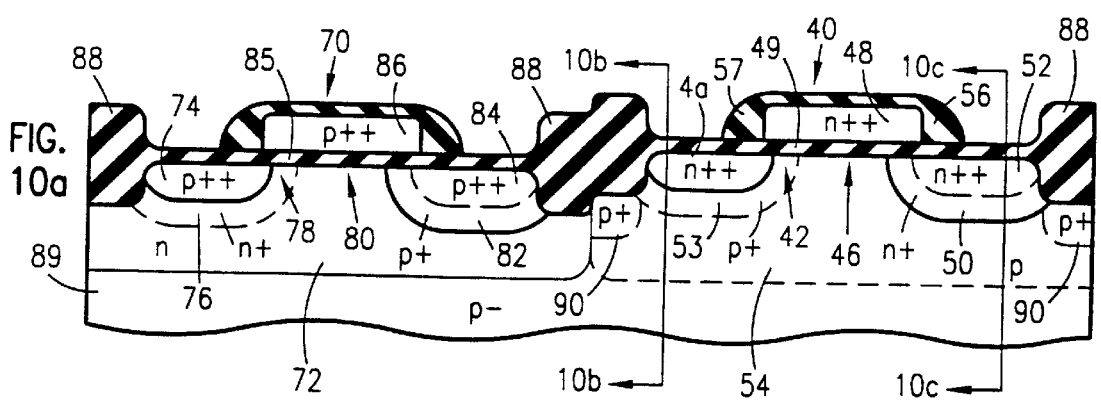
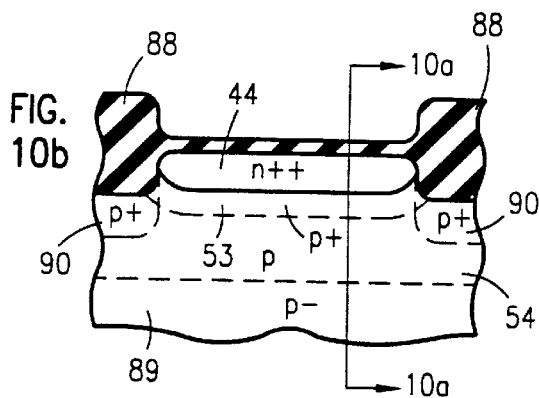
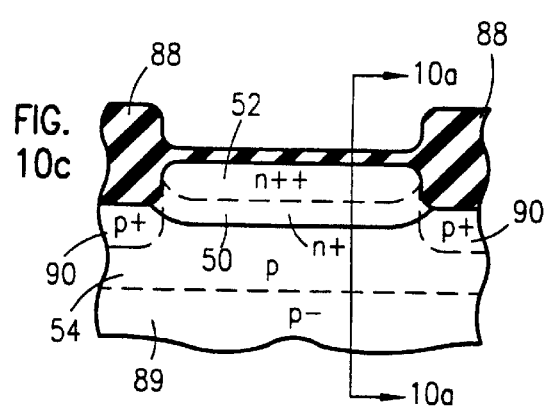
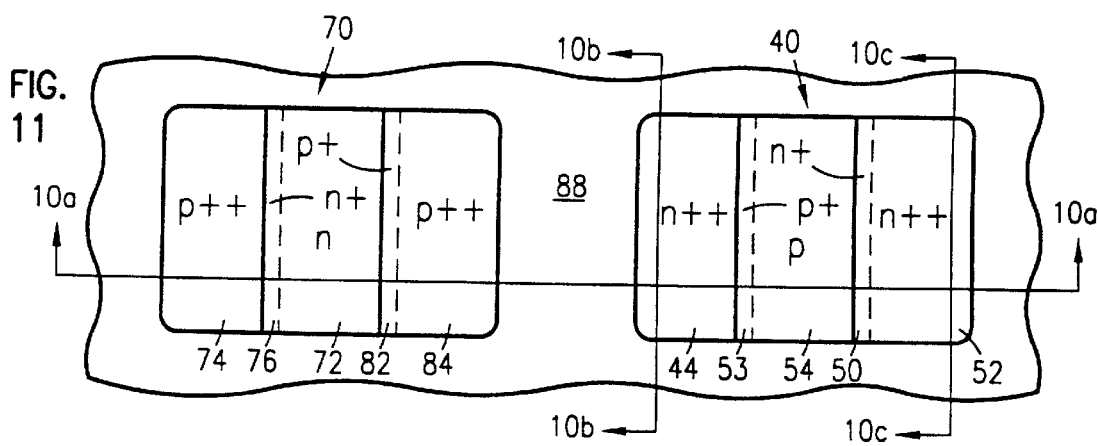

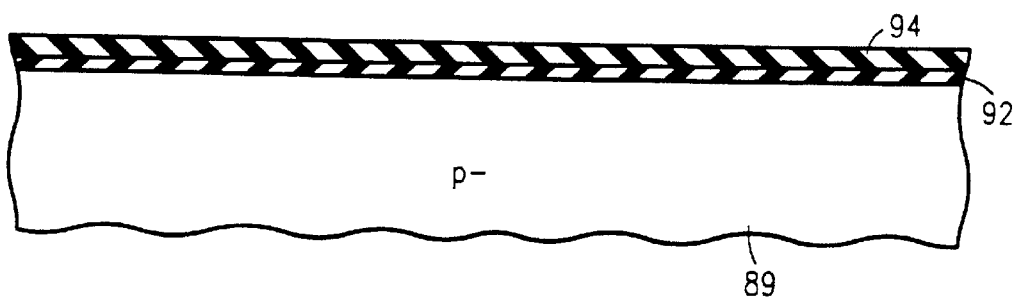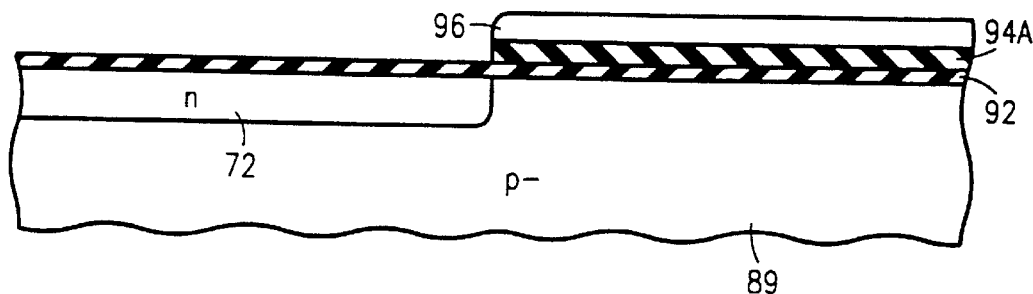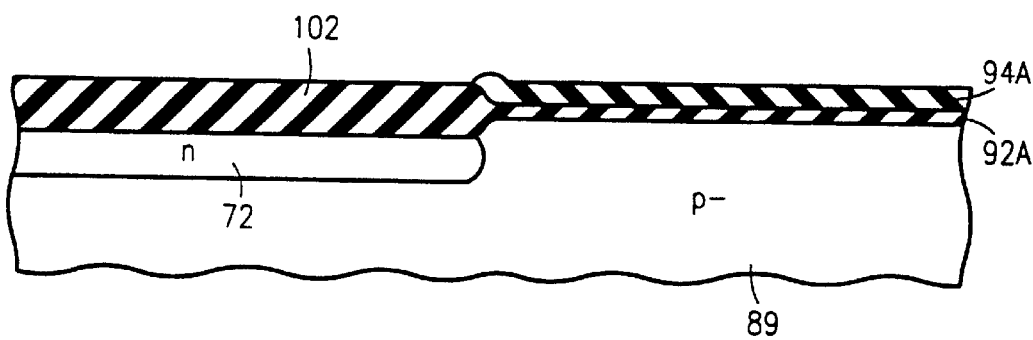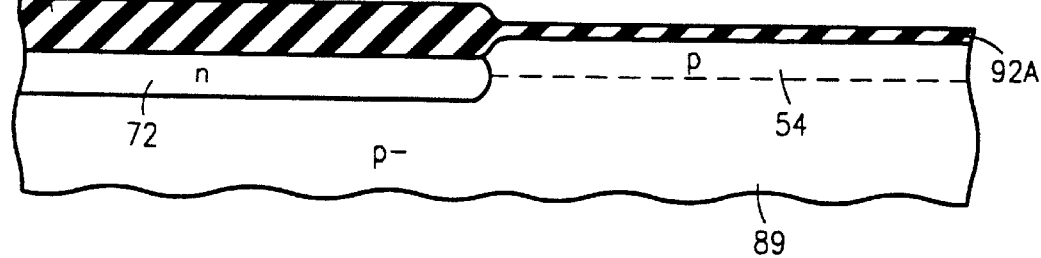

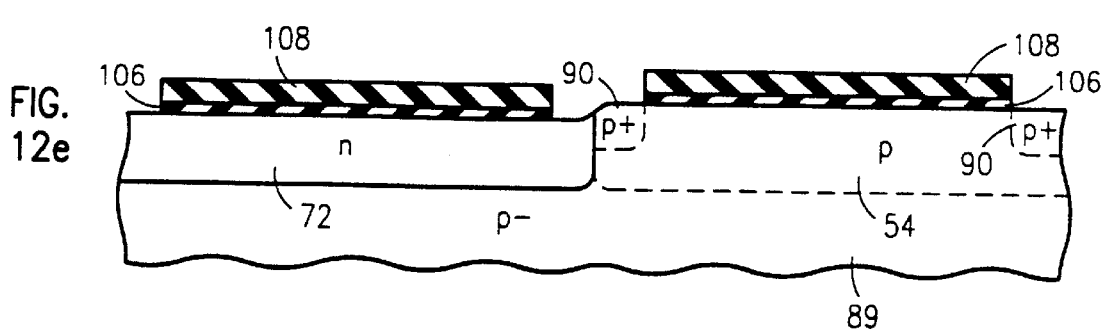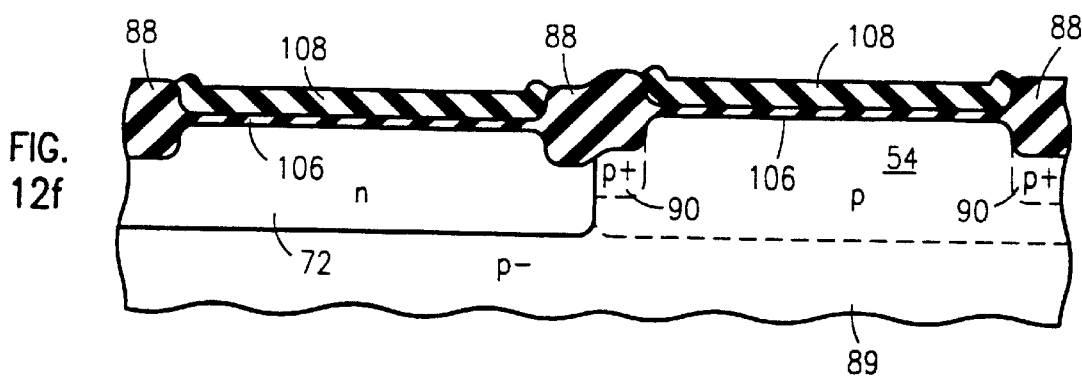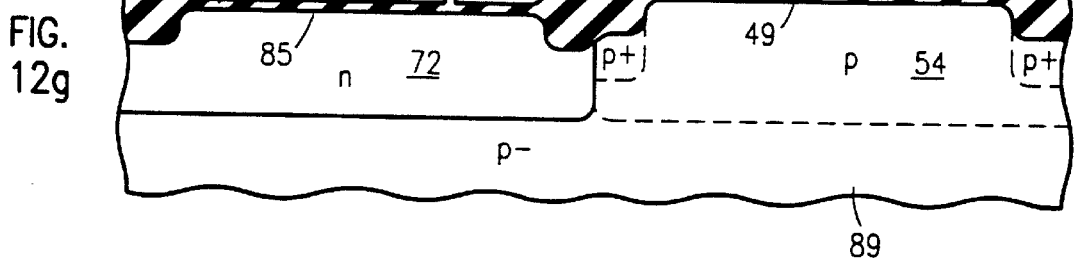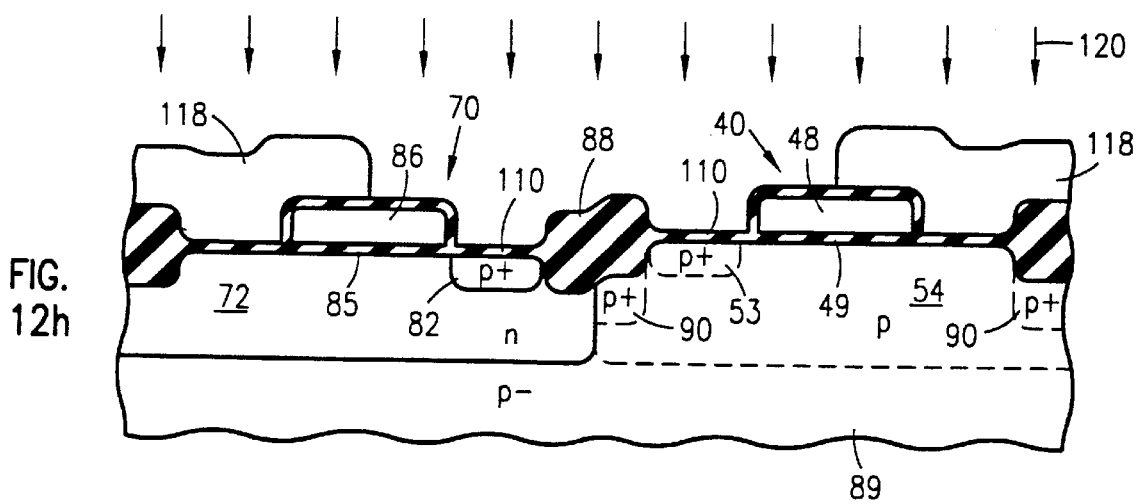

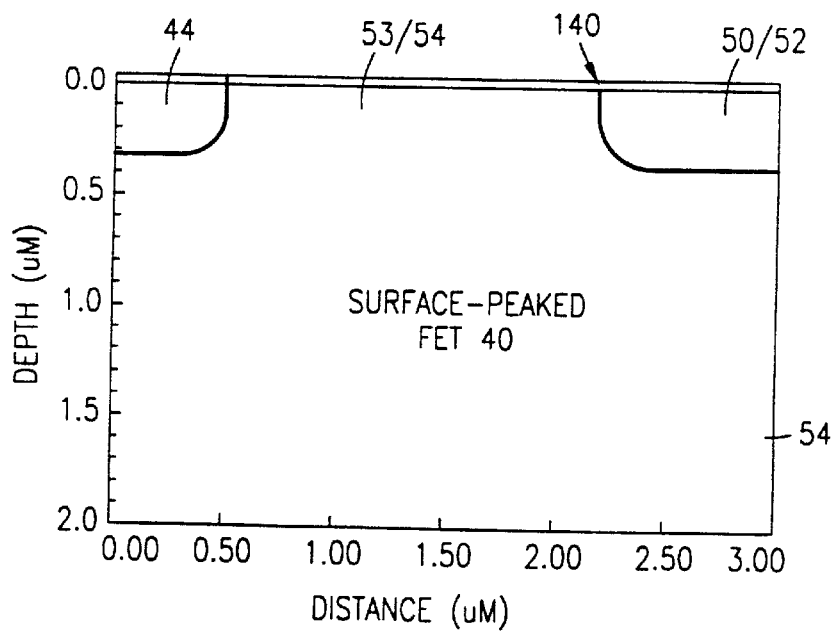
FIG. 13
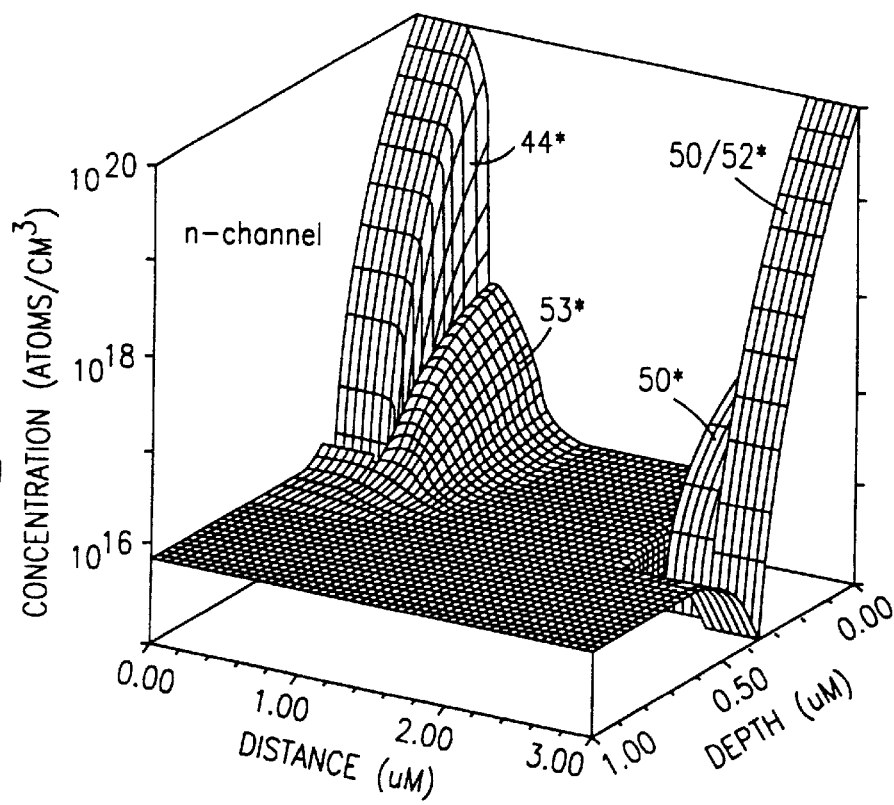
FIG. 14.1
Surface-peaked FET 40

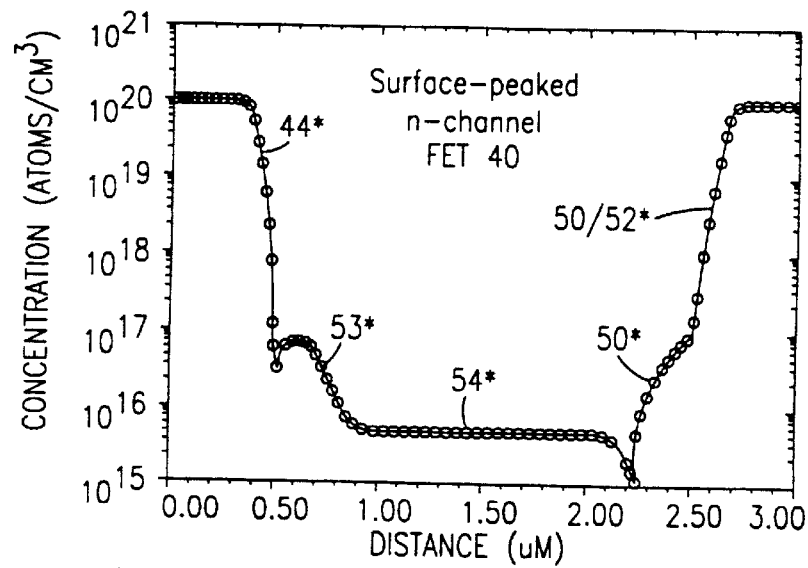
FIG. 14.2
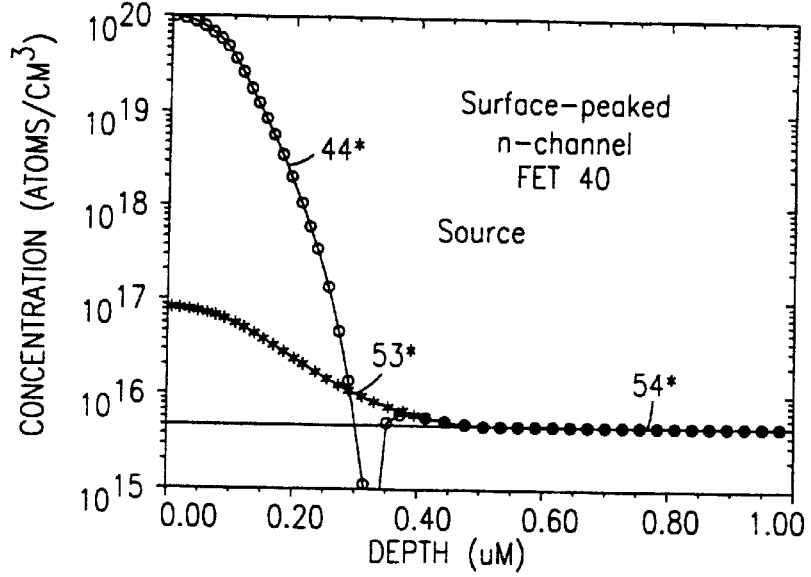
FIG. 14.3
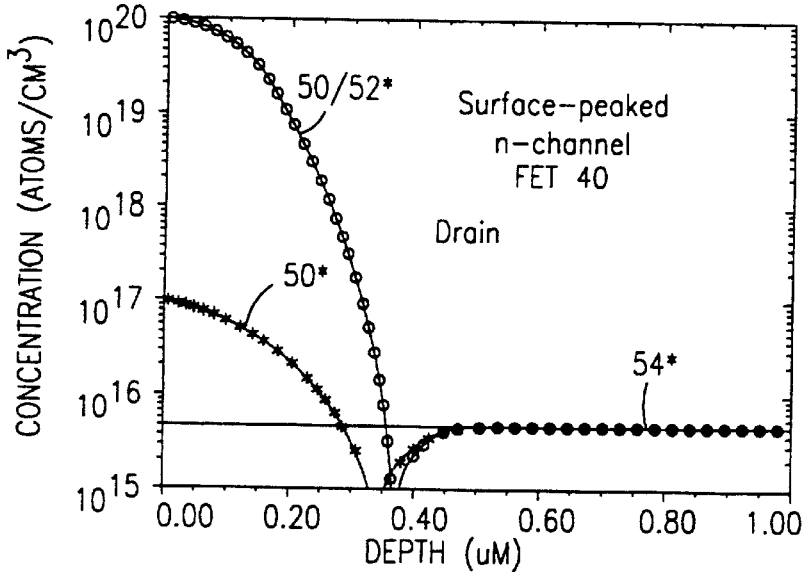
FIG. 14.4

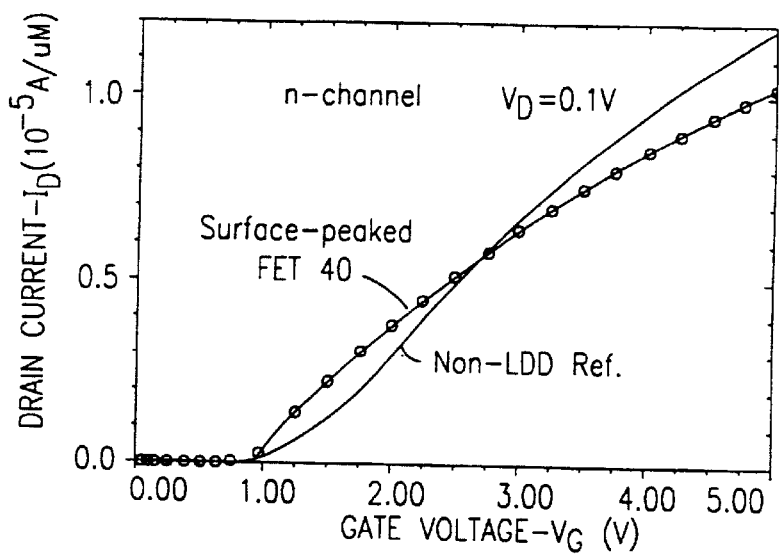
FIG. 15.1
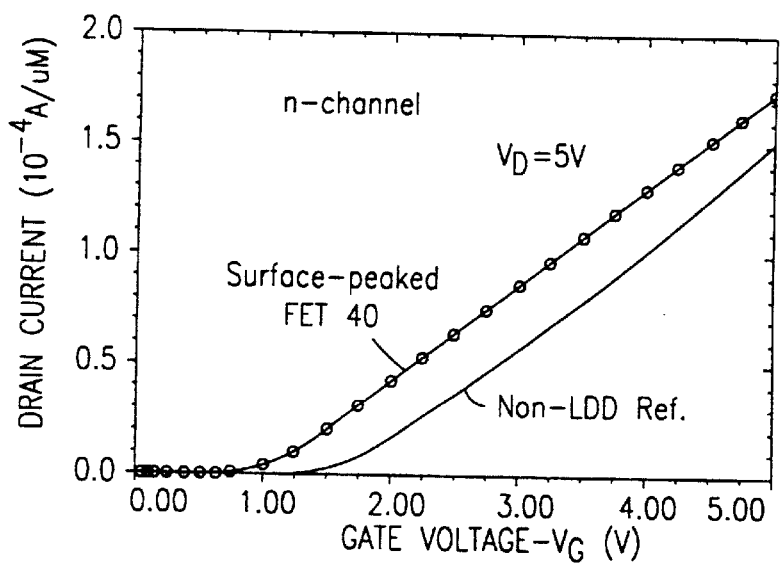
FIG. 15.2
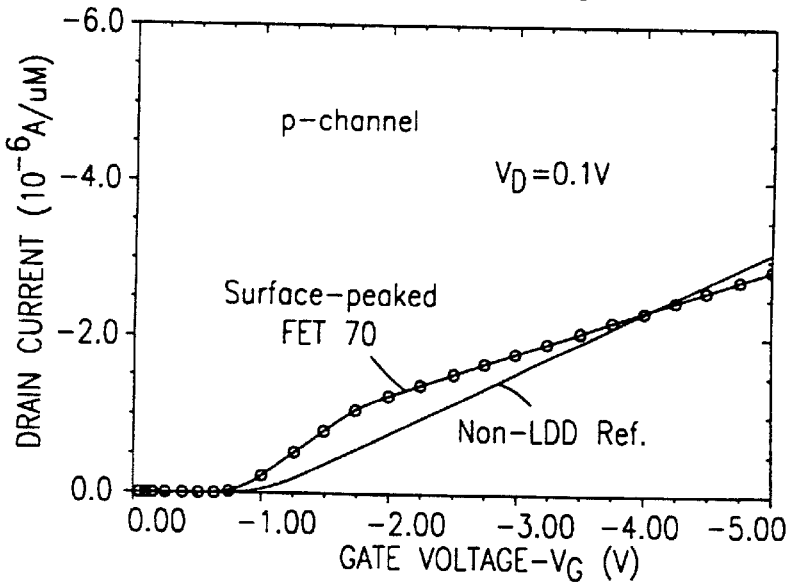
FIG. 16

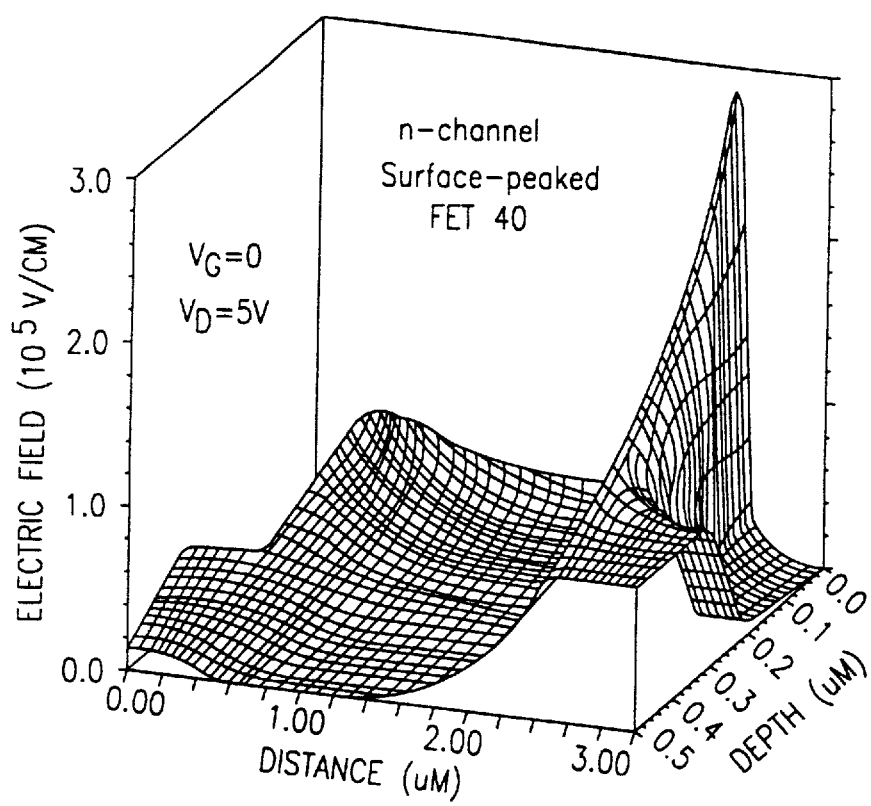
FIG. 17.1
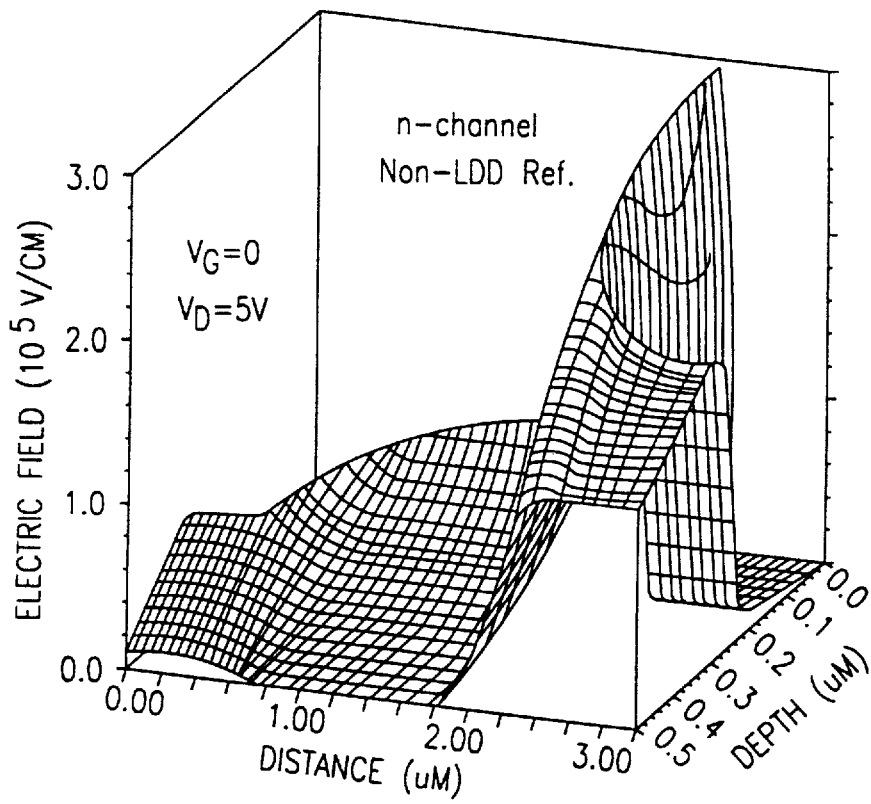
FIG. 17.2

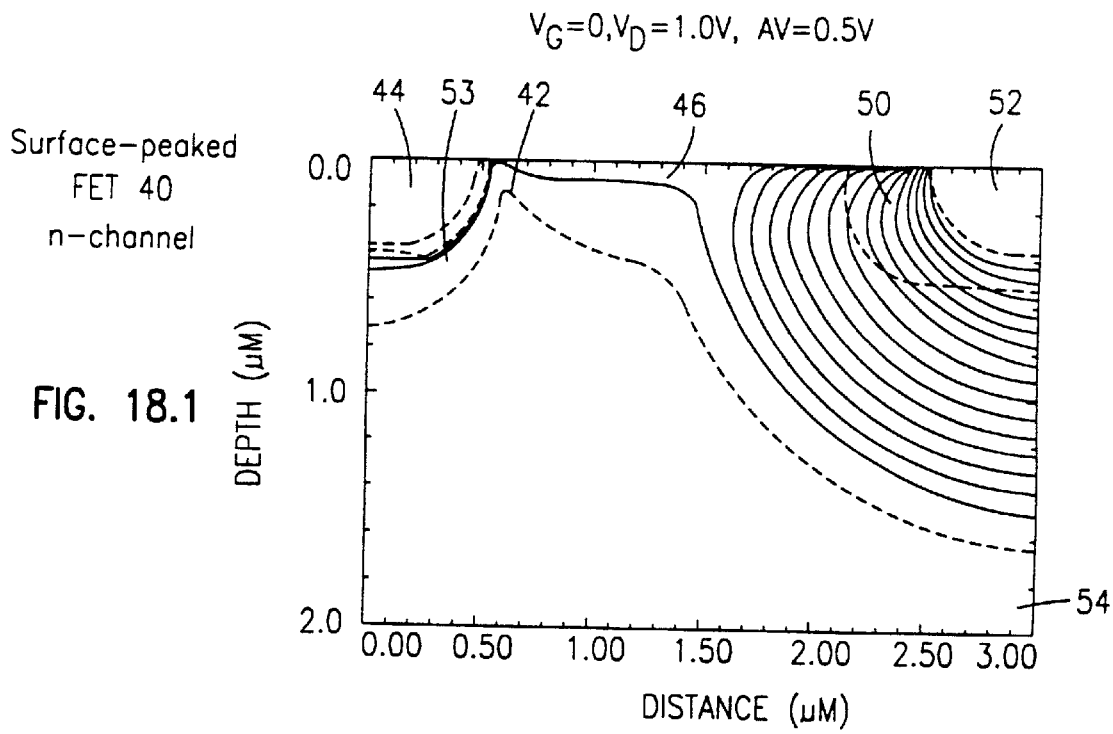
FIG. 18.1
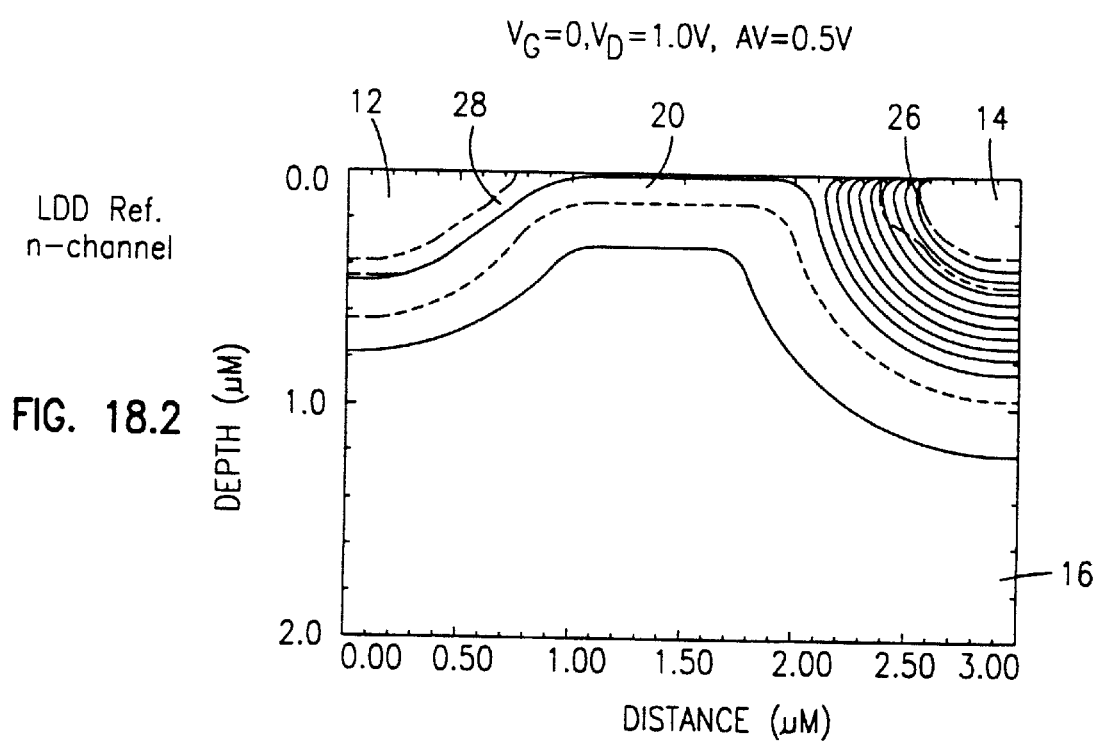
FIG. 18.2

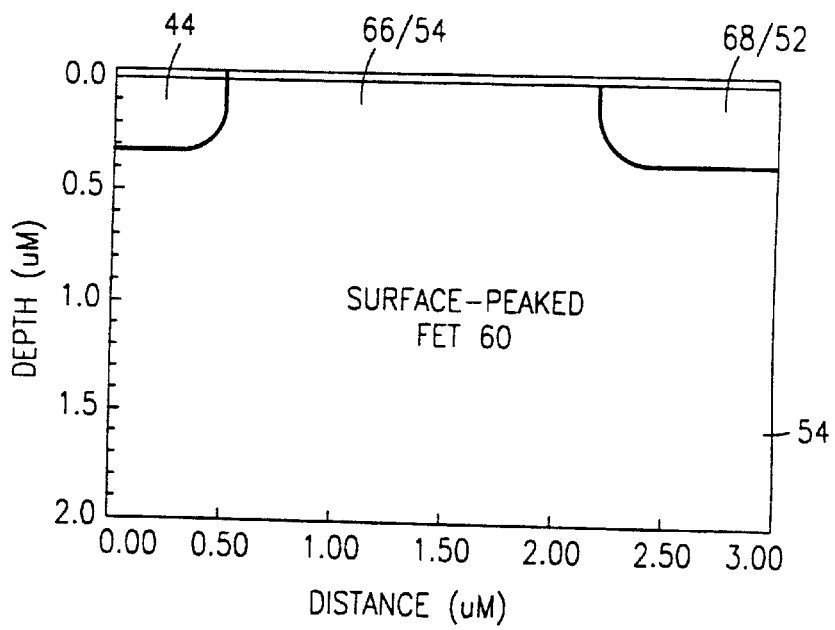
FIG. 19
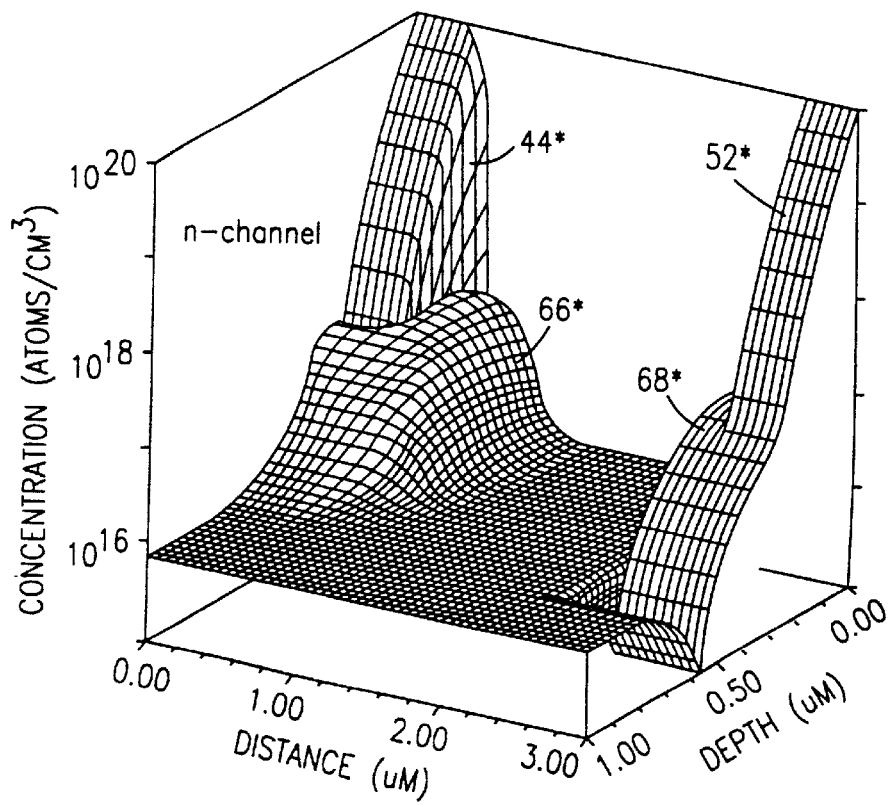
FIG. 20.1
Surface-peaked FET 60

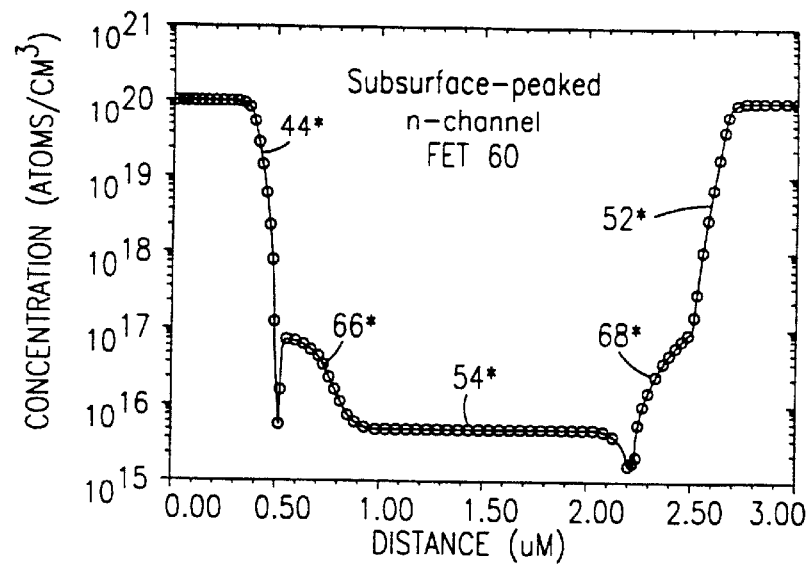
FIG. 20.2
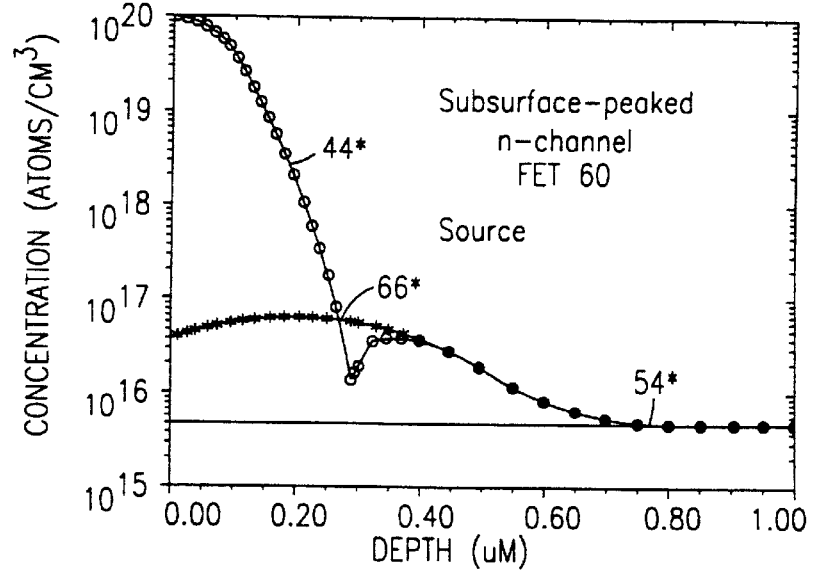
FIG. 20.3
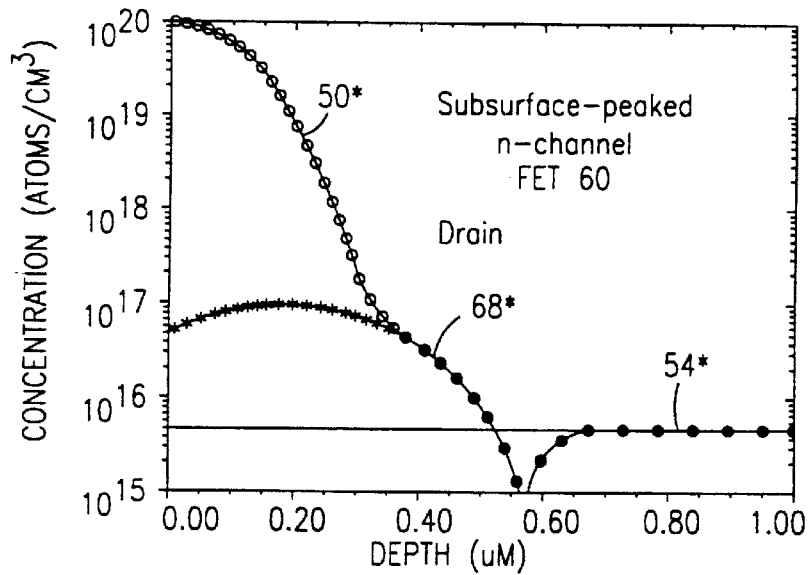
FIG. 20.4

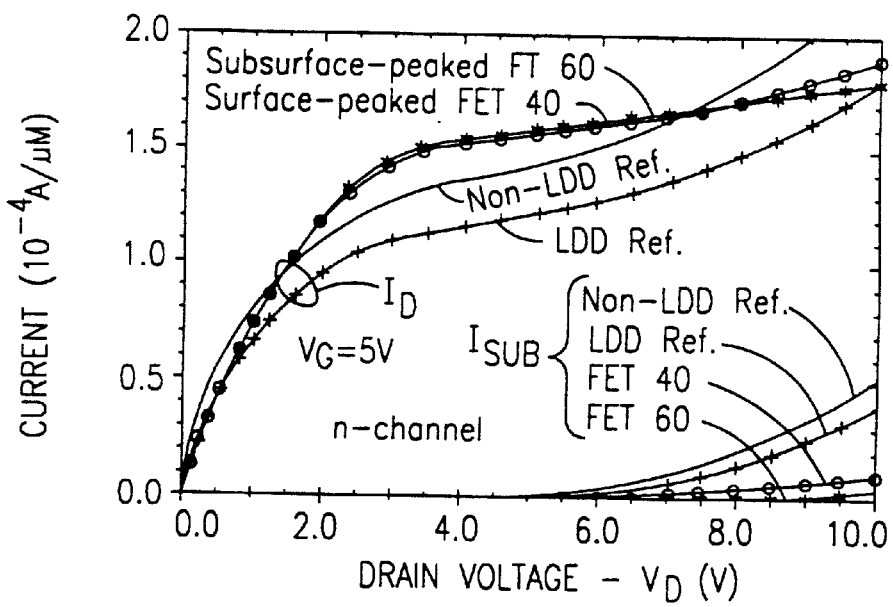
FIG. 21.1
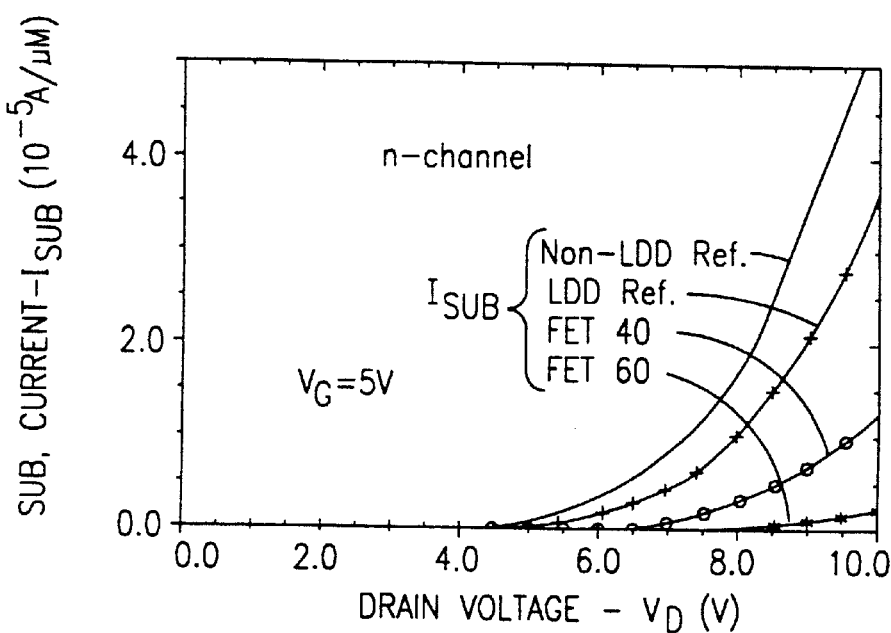
FIG. 21.2

FIELD-EFFECT TRANSISTOR HAVING MULTI-PART CHANNEL

CROSS REFERENCE TO RELATED APPLICATIONS

This is a continuation of U.S. patent application Ser. No. 08/893,628, filed Jul. 11, 1997, now U.S. Pat. No. 6,078,082, which is a continuation of U.S. patent application Ser. No. 08/420,927, filed Apr. 12, 1995, now abandoned.

FIELD OF USE

This invention relates to insulated-gate field-effect transistors ("FETs")and, in particular, to an insulated-gate FET having improved operating characteristics.

BACKGROUND

Field-effect transistors of the MOS type are currently the principal active vehicle in very-large-scale integrated ("VLSI")circuits, particularly in CMOS circuit implementations. Device miniaturization has brought the horizontal FET dimensions down to the 0.5 to 2.0 μm range, and the dielectric thickness under the gate electrode down to the 0.015 to 0.040 μm range. The lower ends of these ranges are characteristic of digital integrated circuits operated at a supply voltage of 5 or 3.3 V, while the upper ends of these ranges are characteristic of analog integrated circuits operated at a supply voltage in excess of 10 V.

FIG. 1 illustrates a basic n-channel MOS transistor 10. Heavily doped n-type source 12 and drain 14 are situated in a p-type silicon substrate 16. An n-type polysilicon gate electrode 18 is insulated from a channel region 20 by oxide gate dielectric layer 22.

The maximum electric field in the silicon in the vicinity of drain zone 14 occurs at the intersection 23 of the drain pn junction and the silicon/silicon oxide interface. One of the earliest observed limitations of the conventional FET structure in FIG. 1 was that the (maximum) electric field at point 23 was related to the electric field across oxide gate dielectric 20 rather than to the field across the bulk portion of the drain junction depletion region. To a first approximation, the breakdown voltage $V_{DB}$ of the drain junction at values of the gate voltage $V_G$ below the threshold level is determined from the following pair of equations for an n-channel device:

$$E_{MAX} = \alpha\left(\frac{V_{DB} - V_G}{X_0}\right) \quad (1)$$

$$E_{MAX} = E_{CRIT} \quad (2)$$

where $E_{MAX}$ is the maximum field in silicon at the drain junction, $E_{CRIT}$ is the maximum field at breakdown in silicon (customarily referred to as "critical field"), $x_0$ is the gate oxide thickness, and α is a factor in the vicinity of ⅓. $E_{CRIT}$ is assumed to be constant. See Grove, "Effect of Surface Fields on the Breakdown Voltage of Planar Silicon p-n Junctions," *IEEE Trans. Elec. Devs.*, March 1967, pages 157–162.

Further, drain junction breakdown voltage $V_{DB}$ increases as the background (substrate) dopant concentration decreases. This is a second-order effect not reflected in simplified Eq. 1. The $V_{DB}$ increase with decreasing background dopant concentration originates from a slow variation of the critical field $E_{CRIT}$ as a function of the background dopant concentration and is present, to different extents, at any gate oxide thickness. Another second-order effect not reflected in Eq. 1 is that breakdown voltage $V_{DB}$ decreases as the depth of the drain junction decreases.

The values of drain breakdown voltage $V_{DB}$ determined by the thin gate oxides typically used in VLSI circuits are less than what the gate length, background concentration, and the drain junction curvature could support with thicker gate oxides.

More important than the breakdown voltage reduction associated with the insulated gate structure in FIG. 1 is that avalanche breakdown of the drain junction is localized at the upper silicon surface. This situation is customarily referred to as surface breakdown and impairs device reliability due to associated hot-carrier effects.

First consider the condition in which the gate voltage $V_G$ is below the threshold level so that FET 10 is turned off. Under the high electric field present where drain 14 terminates channel 20, the holes created by impact ionization in an n-channel device can acquire sufficient energy (become sufficiently "hot") to surmount the energy barrier between the semiconductor (channel 20) and gate dielectric 22. Some of the hot holes jump (get injected) into gate dielectric 22 where they may become trapped. This causes threshold voltage instability and/or transconductance degradation.

Similar effects take place when the transistor is turned on—i.e., gate voltage $V_G$ is above the threshold level—and drain 14 approaches an avalanche breakdown condition in which electron-hole pairs are generated. In this case, the hot electrons are injected into gate oxide 22 while the holes flow into substrate 16. Also, avalanche-generated holes flow into substrate 13 biasing it positively with respect to source 12. The source-substrate junction becomes forward biased. This causes the drain current to increase abnormally and ultimately leads to a premature breakdown condition. Such hot-carrier effects are more critical in n-channel FETs than in p-channel FETs because the impact ionization rates of electrons are one to two orders of magnitude higher than those of holes.

One solution to the above problems is to reduce the level of drain doping at the upper silicon surface where the drain terminates the channel by using a lightly doped drain ("LDD")process. See Ogura et al, "Design and Characteristics of the Lightly Doped Drain-Source (LDD) Insulated Gate Field-Effect Transistor," *IEEE Trans. Elec. Devs.*, August 1980, pages 1359–1367. Also see Ogura et al, "Elimination of Hot Electron Current by the Lightly Doped Drain Structure," IEDM, 1981, pages 651–654.

The LDD solution, illustrated by n-channel MOS transistor 24 in FIG. 2, is widely used in current VLSI products. The drain consists of main portion 14 and a more lightly doped drain extension 26 that extends slightly under gate electrode 18. Fabrication of the LDD structure entails ion implanting drain extension 26 in a self-aligned manner, followed by implantation and drive-in diffusion of heavily doped main drain portion 14. The lateral edge of main drain portion 14 is separated laterally from the lateral edge of drain extension 26 and gate electrode 18 by providing an insulating spacer 27 along the drain side of gate electrode 18 during the time between the two implantations. Spacer 27 and gate electrode 18 serve as an implant shield during the second implant so as to control the location of LDD extension 26 relative to main drain portion 14.

The source of the LDD FET is formed simultaneously with the drain and is typically configured in the same way. As shown in FIG. 2, the source consists of main source portion 12 and a more lightly doped source extension 28. For reasons of fabrication simplicity and also source/drain symmetry, the LDD implant is applied identically to the source to form source extension 28. An insulating spacer 29 provided along the source side of gate electrode 18 acts to control the location of source extension 28 relative to main source portion 12.

The LDD solution is effective when the surface doping concentration of LDD extension 26 is in the vicinity of $10^{17}$ atoms/cm$^3$, down from $10^{20}$ atoms/cm$^3$ in main drain portion 14. This is illustrated in FIG. 3 taken essentially from either of the articles of Ogura et al, cited above. Lateral distance in FIG. 3 is measured from the left-hand edge of FIG. 2. In this regard, note that FIG. 3 is presented at a different scale than FIG. 2.

The LDD structure typically results in a thirty-fold reduction in substrate current compared to FETs using a conventional drain design of the type shown in FIG. 1. The improvement achieved with the LDD structure is explainable using the simplified model of Eq. 1. The thickness of easily depleted LDD extension 26 effectively adds (as an insulator) to the thickness of gate oxide 22, thereby reducing the electric field in the silicon along the drain surface region.

Unfortunately, the large reduction in dopant level around the drain end of channel 22 in the LDD structure of FIG. 2 cannot be accommodated at the source end without degrading the current drive capability of the device due to increased series source resistance. Accordingly, CMOS VLSI processes in current use typically rely on a compromise LDD surface doping concentration in the vicinity of $10^{18}$ atoms/cm$^3$, resulting in a less dramatic reduction of the hot-carrier effects than originally reported. A reflection of this situation is that the subject of hot-carrier effects in MOS devices has continued to occupy a major part of the VLSI literature after the original publication and demonstration of the LDD improvement. Sanchez et al, "Drain-Engineered Hot-Electron Resistant Device Structures: A Review," *IEEE Trans. Elec. Devs.*, June 1989, pages 1125–1132, describes how a number of different LDD structures have attacked the hot carrier problem.

While the reported structures devised for reducing hot-carrier effects at the drains of FETs in VLSI devices do, in part, accomplish this goal, the reported VLSI structures are limited in getting major improvement because they typically employ the same doping profiles at the source and drain. It would therefore be desirable to decouple the design requirements of the drain from those of the source in an integrated FET structure, especially a CMOS structure, so that the hot-carrier reliability improvements are not obtained at the expense of degrading the drive capability of the insulated-gate FETs in the structure.

FIG. 4 illustrates an approach presented in Armijos, "High-Speed DMOS FET Analog Switches and Switch Arrays," application note AN301, *Low-Power Discretes*, Siliconix, Jun. 22, 1994 for increasing the breakdown voltage of a discrete high-voltage n-channel FET 30 created from a lightly doped p-type silicon substrate 31. A lightly doped n-type drain extension 32 extends between a heavily doped n-type main drain portion 33 and a channel region 34 under a gate electrode 35. Drain extension 32 is much shallower than main drain portion 33. A heavily doped n-type source 36 also extends partially below gate electrode 35.

A double-diffusion process is utilized in Armijos to create a p-type body region 38 that extends along source 36 and into channel 34. Armijos states that p-type body region 38 acts to isolate source 36 from the drain. Unfortunately, application of the high-voltage discrete FET of FIG. 4 to low-voltage integrated circuits such as CMOS device is impractical because the use of a LDD extension much shallower than the main drain portion results in an unacceptably high drain series resistance.

GENERAL DISCLOSURE OF THE INVENTION

The present invention furnishes an insulated-gate field-effect transistor configured in a special asymmetric lightly doped drain structure that alleviates hot-carrier injection while simultaneously permitting the source characteristics to be decoupled from the drain characteristics so as to achieve high FET performance in integrated circuit applications. The decoupling of the source and drain characteristics is done with a multi-part channel zone situated in a device region of a semiconductive body. The channel zone has an output (or main) portion and a more heavily doped input (or threshold) portion.

The channel zone separates source and drain zones along the upper surface of the semiconductor body. In particular, the input channel portion is situated between the source zone and the output channel portion. The drain zone is formed with a main drain portion and a more lightly doped drain extension that meets the output channel portion and extends at least as deep into the semiconductive body as the main drain portion. A gate electrode is situated above the channel zone and is vertically separated from it by gate dielectric material.

Coupling of the source zone to the channel zone is achieved without the use of a more lightly doped source extension. The source zone still meets the channel zone at a location sufficiently close to, typically under, the gate electrode such that the gate electrode is capable of controlling the source-to-drain current flow.

Use of a drain extension more lightly doped than the main drain portion enables the electric field at the drain zone to be reduced compared to a conventional non-LDD FET, especially at the upper semiconductor surface where the drain zone meets the channel zone below the gate dielectric material. As a result, hot-carrier injection into the gate dielectric material is substantially reduced, and the value of the FET's threshold voltage does not change significantly with time. Because the drain extension goes at least as deep into the semiconductive body as the main drain portion, the drain electric field is further reduced. Accordingly, the FET structure of the invention is particularly suitable for efficient integrated circuit fabrication, especially in CMOS circuits where high-immunity to hot-carrier effects is desired.

The input channel portion sets the FET threshold voltage and the sub-threshold characteristics. The output channel portion determines the current-voltage characteristics during FET operation. The decoupling of the source and drain characteristics obtained by using the multi-part channel zone enables the doping in the drain extension to be lower than that typically seen in symmetrical prior art LDD FET structures without causing undesirable increase in the source series resistance. For example, the main drain doping is typically in the vicinity of $10^{20}$ atoms/cm$^3$, while the drain extension doping is typically in the vicinity of $10^{17}$ atoms/cm$^3$, thereby enabling the FET of the invention to have a high current drive capability.

The input channel portion is part of a threshold body zone that preferably extends at least as deep into the semiconductive body as the source zone. The dopant profiles of the drain extension and the threshold body zone are typically surface-peaked—i.e., the drain extension and the threshold body zone reach a maximum net dopant concentration no more than 0.05 $\mu$m into the semiconductive body.

Alternatively, the drain extension/threshold body dopant profiles can be subsurface peaked such that the maximum net dopant concentrations of the drain extension and the threshold body zone occur at least 0.05 μm into the semiconductive body. Although formation of subsurface-peaked dopant profiles requires higher energy ion implantation than surface-peaked dopant profiles, a further reduction of hot-carrier injection into the gate dielectric material is achieved with subsurface-peaked profiles.

Two-dimensional computer simulations have fully confirmed the physical model of the invention, and also revealed additional improvements in the transistor driving capability and gate-drain transfer linearity. The FET of the invention exhibits good hot-carrier reliability, improved output resistance characteristics, increased current-drive capability, improved linearity of the saturation transconductance at low currents, and improved switching characteristics.

In an LDD CMOS structure arranged according to the invention, both n-channel and p-channel FETs have multi-part channel zones configured as described above. Fabrication of the CMOS structure typically involves forming the input channel portion of each FET using the process steps that are performed to create the drain extension of the other FET. Accordingly, the CMOS structure of the invention can be fabricated in the same number of steps needed to manufacture a conventional LDD CMOS device that lacks the multi-part channel zones. The invention thus enables a high-performance stable CMOS device to be fabricated without increasing manufacturing complexity.

BRIEF DESCRIPTION OF THE DRAWINGS

FIG. 9 is a cross-sectional view of an n-channel insulated-gate FET having a two-part channel zone and a deep subsurface-peaked n-type LDD extension in accordance with the invention.

FIGS. 10a–10c are cross-sectional views of a CMOS device in accordance with the invention. The cross section of FIG. 10a is taken through plane 10a—10a in FIGS. 10b and 10c. The cross sections of FIGS. 10b and 10c are respectively taken through planes 10b—10b and 10c—10c in FIG. 10a.

FIG. 11 is a layout view of the CMOS structure of FIGS. 10a–10c.

FIGS. 12a–12l are cross-sectional views representing steps in fabricating the CMOS structure of FIGS. 10a–10c in accordance with the invention.

FIG. 13 is a cross-sectional view of an implementation of the n-channel FET of FIG. 5 examined in computer simulations.

FIGS. 14.1–14.4 are dopant concentration graphs for the n-channel FET implementation of FIG. 5 examined in computer simulations.

FIG. 15.1 is a graph of drain current as a function of drain voltage at a sub-threshold condition for computer simulations of the n-channel FET implemented in FIGS. 13 and 14.1–14.4 (collectively "FIGS. 13/14")and (b) a reference non-LDD n-channel FET. FIG. 15.2 is a graph of drain current as a function of drain voltage at a saturation condition for (a) the n-channel FET implemented in FIGS. 13/14 and (b) the reference non-LDD n-channel FET.

FIG. 16 is a graph of drain current as a function of drain voltage at a sub-threshold condition for computer simulations of (a) an implementation of the p-channel FET of FIG. 10a having characteristics of the type shown in FIGS. 13/14 and (b) a reference non-LDD p-channel FET.

FIGS. 17.1 and 17.2 are respective three-dimensional graphs of electric field at a sub-threshold condition for (a) the n-channel FET implemented in FIGS. 13/14 and (b) the reference non-LDD n-channel FET.

FIGS. 18.1 and 18.2 are equipotential graphs at a saturation condition for (a) the n-channel FET implemented in FIGS. 13/14 and (b) a reference LDD n-channel FET.

FIG. 19 is a cross-sectional view of an implementation of the n-channel FET of FIG. 9 examined in computer simulations.

FIGS. 20.1–20.4 are dopant concentration graphs for the n-channel FET implementation of FIG. 9 examined in computer simulations.

FIG. 21.1 is a graph of drain and substrate current as a function of drain voltage at a saturation condition for (a) the n-channel FET implemented in FIGS. 13/14, (b) the n-channel FET implemented in FIGS. 19 and 20.1–20.4 (collectively "FIGS. 19/20"), (c) the reference non-LDD n-channel FET and (d) the reference LDD n-channel FET. FIG. 21.2 is a magnified view of the lower right-hand part of FIG. 21.1.

Like reference symbols are used in the drawings and in the description of the preferred embodiments to represent the same, or very similar, item or items.

DESCRIPTION OF THE PREFERRED EMBODIMENTS

Figure 5:
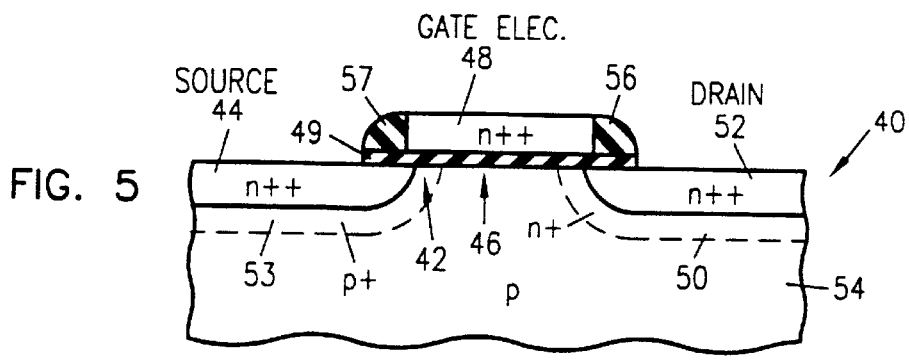
FIG. 5 is a cross-sectional view of an n-channel insulated-gate FET having a two-part channel zone and a deep surface-peaked n-type LDD extension in accordance with the invention.

FIG. 5 illustrates a structure for an enhancement-mode LDD insulated-gate FET 40 suitable for an integrated circuit, such as a CMOS device, in accordance with the invention. FET 40 has a two-part channel zone that includes a short input (or threshold) channel portion 42 adjacent to a heavily doped source zone 44. Input channel portion 42 extends to an output (or main) channel portion 46, both channel portions being induced by a voltage applied to a common gate electrode 48 overlying them. Input channel portion 42 is more heavily doped than output channel portion 46. Gate electrode 48 is electrically insulated from channel portions 42 and 46 by a silicon oxide gate dielectric layer 49.

The FET's drain consists of a drain extension 50 and a heavily doped main drain portion 52. Drain extension 50 adjoins output channel portion 46. Drain extension 50, which is more lightly doped than main drain portion 52, encloses drain portion 52 and thus extends further below the upper semiconductor surface than drain portion 52. LDD extension 50 typically has a maximum net doping in the vicinity of $10^{17}$ atoms/cm$^3$. Main drain portion 52, along with source zone 44, has a maximum net doping in the vicinity of $10^{20}$ atoms/cm$^3$.

LDD extension 50 extends partially under gate electrode 48. The dopant concentration of main drain portion 52 tapers off in moving from a heavily doped core section towards the internal silicon main drain periphery, indicated generally by dashed line in FIG. 5, where the dopant concentration of portion 52 becomes equal to the dopant concentration of LDD extension 50. Although FIG. 5 indicates that main drain portion 52 extends slightly under gate electrode 48, only the more lightly doped part of drain portion 52 underlies electrode 48. The heavily doped core of main drain portion 52 is spaced laterally apart from gate electrode 48.

Input channel portion 42 is formed in a threshold body zone 53 of such doping, typically a maximum in the vicinity of $10^{17}$ atoms/cm$^3$, as to produce a specified threshold voltage for transistor 40. Threshold body zone 53 surrounds source zone 44 within the semiconductor material. Source zone 44 forms a pn junction with threshold body zone 53 at a location sufficiently close to gate electrode 48, preferably slightly under electrode 48 as shown in FIG. 5, that application of suitable voltage to FET 40 enables gate electrode 48 to control the source-to-drain current flow. Output channel portion 46 is formed in a lightly doped main body (or device) region 54 of a monocrystalline silicon semiconductive body such that output channel portion 46 is already on when a voltage around the threshold voltage of transistor 40 is applied to gate electrode 48.

FIG. 5 specifically illustrates an n-channel implementation for which source zone 44 and the drain zone are of n-type conductivity. Threshold body zone 53 and main body region 54 are of p-type conductivity.

The maximum net dopant concentrations in threshold body zone 53 and drain extension 50 occur at, or very near, the upper semiconductor surface. In particular, the maximum net dopant concentrations of LDD extension 50 and body zone 53 occur no more than 0.05 μm deep into device region 54. Accordingly, the dopant profiles for threshold body zone 53 and LDD extension 50 are surface-peaked.

When fabricated according to a process (described below) having a 2-μm minimum feature size, the source/drain junction depth is typically 0.35 μm. Gate dielectric layer 4 typically has a thickness of 0.04 μm. Table I below shows how the dimensions scale down for processes having smaller feature sizes:

TABLE I

| Minimum feature size (μm) | Gate-oxide thickness (μm) | Source/drain junction depth (μm) |
|---|---|---|
| 2.0 | 0.04 | 0.35 |
| 1.0 | 0.025 | 0.25 |
| 0.5 | 0.015 | 0.15 |

Preferred embodiments of the invention also incorporate the following features:

1. LDD extension 50 is used in conjunction with a silicon oxide spacer 56 provided along the drain side of gate electrode 48 for separating the heavily doped core of main drain portion 52 from the channel area. A companion silicon oxide spacer 57 is situated along the source side of electrode 48. Spacers 56 and 57 are, as described below, utilized in defining the locations of source zone 44 and main drain portion 52. The source/drain dopant profiles and the spacer widths are correlated in such a way that source zone 44 extends close enough to gate electrode 48 to achieve good source-to-channel coupling while simultaneously maintaining the heavily doped core of main drain portion 52 at a safe distance away from the channel.

2. In a CMOS version, both p-channel and n-channel FETs are provided with two-part channels as described above for the FET of FIG. 5. The complementary FETs have polysilicon gate electrodes doped respectively the same as their self-aligned source/drain zones—i.e., n-type for n-channel FETS, and p-type for p-channel FETs. This results in symmetrical surface-channel complementary enhancement-mode devices.

3. LDD extension 50 penetrates into main body region 54 at least as deep as, and typically deeper than, the source/drain junctions without causing drain-source punch-through or other short-channel effects. Excessive gate-to-drain capacitance is not produced. By having LDD extension 50 extend to such a depth into body region 54, the junction curvature along the drain/main body junction is reduced. This reduces the electric field along the drain/main body junction, particularly at the upper semiconductor surface, thereby reducing hot-carrier injection into gate dielectric 49.

4. In CMOS implementations, the same self-aligned doping level and profiles are used in LDD extensions and in threshold body zones to permit, with proper masking, simultaneous fabrication of corresponding regions of n-channel and p-channel devices. This process architecture results in FET structures with deeper drain junctions and shallower source junctions compared to those obtained in a conventional CMOS process.

Figure 6:
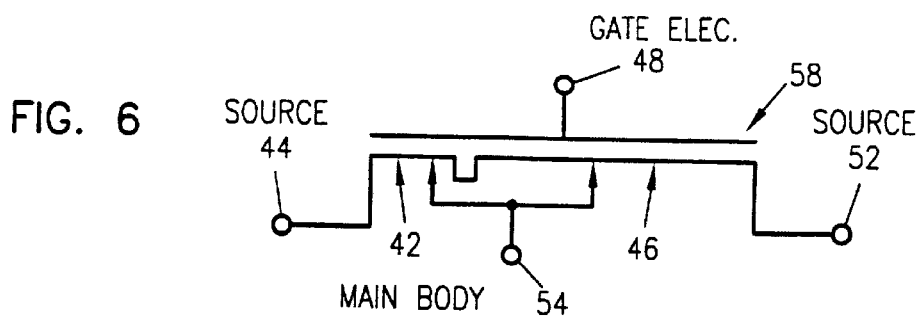
FIG. 6 is a circuit representation of the n-channel FET of FIG. 5 illustrating the FET's input and output channel portions.

The FET structure of FIG. 5 operates as a MOS device having two channels connected in series under the same gate electrode 48, as represented in the simplified electrical model 58 of FIG. 6. Input channel portion 42 sets the threshold voltage and the sub-threshold characteristics for the entire structure, acting like a gate-controlled bottleneck to the source-to-drain current. Output channel portion 46 is turned on at most times, thereby determining the output and transfer characteristics in normal operation. The absence of a lightly doped source extension allows a high current drive capability to be achieved while LDD extension 50 improves the hot-carrier reliability without reducing the drain current.

Figure 7:
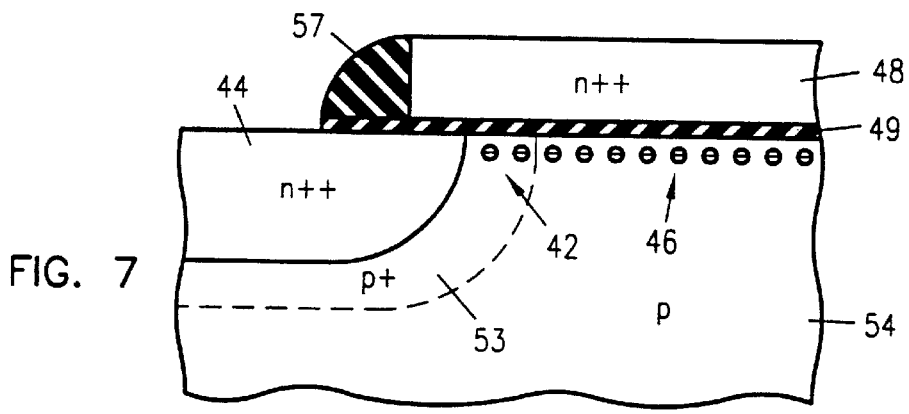
FIG. 7 is a magnified view of a portion of the n-channel FET of FIG. 5.
Figure 8:
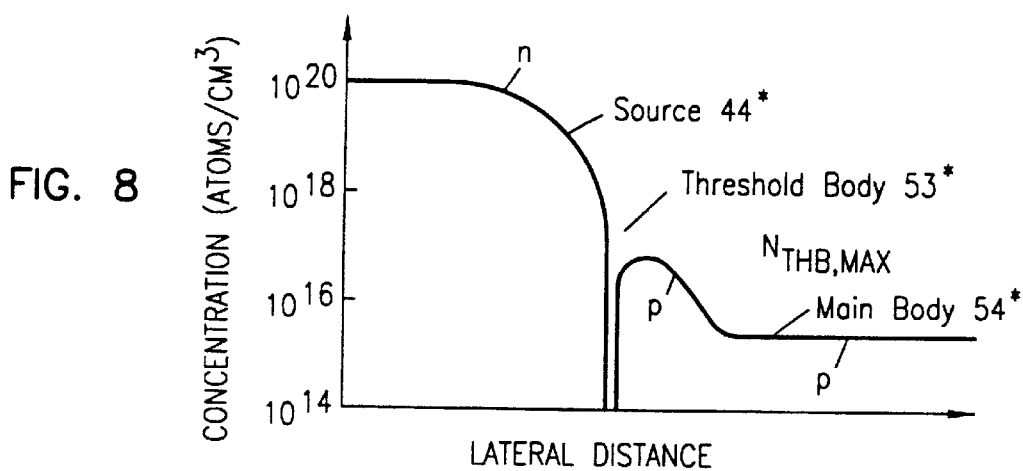
FIG. 8 is a dopant profile along the upper semiconductor surface for the magnified FET portion in FIG. 7.

FIG. 7 illustrates a magnified view of part of the FET of FIG. 5 centering around input channel portion 42. FIG. 8 depicts a typical surface dopant profile for the magnified view of FIG. 7. Lateral distance in FIG. 8 is measured., from the left-hand edge of FIG. 7. The numerical portions of the starred reference symbols in FIG. 8 indicate the like-numbered regions in FIG. 7. In a simplified embodiment, main body region 54 has a constant doping profile as shown in FIG. 8. The dopant concentration of this profile in body region 54 is three to ten times smaller than what a conventional MOS transistor would have at the same threshold voltage.

The dopant profile of threshold body zone 53 for input channel portion 42 is a peaked diffused profile resulting from the combination of a threshold body profile, applied and rotated about the edge of gate electrode 48, and a recessed source/drain profile applied and rotated about the edges of spacers 56 and 57 as represented in FIG. 8. The peak value of the dopant profile of threshold body zone 53, designed to be in the vicinity of $10^{17}$ atoms/cm$^3$, determines the threshold voltage of entire transistor 40 for typical 1–2 $\mu$m VLSI gate lengths.

Specifically, the maximum net dopant concentration in both input channel portion 42 and LDD extension 50 is preferably in the range of $5\times10^{16}$–$5\times10^{17}$ atoms/cm$^3$. The maximum net dopant concentration in source zone 44 and main drain portion 52 is preferably in the range of $5\times10^{19}$–$2\times10^{20}$ atoms/cm$^3$. These ranges apply to minimum feature sizes of 2 $\mu$m down to 0.5 $\mu$m.

In an insulated-gate FET, punch-through occurs when the drain depletion region extends to the source depletion region. Because the body region that normally separates the two depletion regions is eliminated, the source-to-drain current can increase in a generally undesirable manner as the magnitude of the drain-to-source voltage increases. The length of output channel portion 46, together with input channel portion 42, is chosen to resist punch-through at the maximum voltage applied to main drain portion 52. For a fabrication process of the type described below with a 2-$\mu$m minimum feature size with scaling down to 1 $\mu$m, punch-through is not of concern for gate lengths of minimum size. Gate lengths may have to exceed the minimum feature size in a scaled process having a sub-$\mu$m feature size. Alternatively, additional dopant profile improvements may be required to avoid punch-through at sub-$\mu$m minimum feature sizes.

Unlike a conventional CMOS process, where the threshold voltages are controlled by the level of the background doping combined with a threshold adjust implant, the threshold voltage in the present structure is controlled largely by the dopant profile of threshold body zone 53. The thickness of oxide spacers 56 and 57 which, as described below, provide lateral separation between the edge of source zone 44 and the edge of threshold body zone 53, also influences the threshold voltage and needs to be controlled accurately. Spacers 56 and 57 typically have a width of 0.25 $\mu$m in a 2-$\mu$m minimum feature size example.

FIG. 9 illustrates an alternative structure for an LDD insulated-gate enhancement-mode FET suitable for an integrated circuit in accordance with the invention. The FET in FIG. 9 has a two-part channel zone consisting of an input portion 62 and an output portion 64. Input portion 62 is more heavily doped than output portion 64.

Input channel portion 62 occupies part of a threshold body zone 66 that encloses source zone 44. The drain zone consists of heavily doped main drain portion 52 and a more lightly doped drain extension 68 that surrounds main drain portion 52 within the semiconductive material and meets output channel portion 64. Accordingly, threshold body zone 66 and LDD extension 68 both extend deeper into device region 54 than source zone 44 and main drain zone 52. The FET shown in FIG. 9 is an n-channel device so that main body region 54 is again p-type, while source zone 44 and the drain zone are n-type.

The maximum net doping concentrations in threshold body zone 66 and LDD extension 68 occur at a depth of at least 0.05 $\mu$m below the upper silicon surface. That is, the dopant profiles for threshold body zone 66 and LDD extension 68 are subsurface-peaked. As a result, the maximum electric field in the silicon material extending between threshold body zone 66 and drain extension 68 occurs below the upper surface of device region 54. By moving the location of the maximum electric field below the upper silicon surface, the subsurface doping in LDD extension 68 reduces the probability that hot electrons created in main drain portion 52 can reach the silicon/silicon oxide interface with sufficient energy to jump into gate oxide 49. This yields additional improvement in hot-carrier reliability beyond that achieved with surface-peaked FET 40.

Certain compromises need to be made in designing subsurface-peaked FET 60. For example, the total LDD doping level need to be increased in order to attain the same LDD dopant concentration at the upper semiconductor surface as in surface-peaked FET 40. Likewise, the total threshold body doping needs to be increased in subsurface-peaked FET 60 to achieve the same threshold voltage as in surface-peaked FET 40.

As with the surface-peaked FET structure of FIG. 5, the subsurface-peaked FET structure of FIG. 9 is typically used in a CMOS circuit in which both p-channel and n-channel FETs have two-part channel zones of the preceding type. The CMOS subsurface-peaked structure is fabricated in the way described below for manufacturing the CMOS surface-peaked structure, except that the ion implantations for defining the threshold body zones and the LDD extensions are performed at greater energies in the subsurface-peaked case than in the surface-peaked case. The steps employed to create a p-type threshold body zone for the n-channel FET also create a p-type LDD extension for the p-channel FET, and vice-versa. The parameter values that set the threshold voltage for each FET are used unchanged in forming the LDD extension for the other FET.

Simulations of subsurface-peaked FETs with two-part channel zones have indicated that the peak threshold body doping levels needed to insure the same threshold voltage as in a conventional LDD CMOS implementation are still in the vicinity of $10^{17}$ atoms/cm$^3$ for implantation depths between 0.1 and 0.2 $\mu$m (i.e., peak threshold-body doping depth) while still maintaining the dopant profile requirements for an efficient LDD implant. In addition to reducing the hot-carrier injection probability at a given drain voltage, subsurface LDD implants increase the drain breakdown voltage by increasing the radius of curvature along the drain junction.

FIGS. 10a–10c (collectively "FIG. 10") illustrate a CMOS device having an n-channel transistor 40, similar to that shown in FIG. 5, and a p-channel transistor 70, similar to transistor 40 but with the conductivity types reversed. Both of FETs 40 and 70 are shown in FIG. 10a. FIGS. 10b and 10c respectively show transverse source and drain cross sections for n-channel FET 40. P-channel FET 70 has similar transverse source and drain cross sections. FIG. 11 illustrates the layout of the CMOS structure of FIG. 10 along the upper semiconductor surface.

P-channel FET 70 is created from an n-type device (main body) region 72. The components of p-channel transistor 70 include a heavily doped p-type source zone 72, a p-type threshold body zone 76, an input (or threshold) channel portion 78, an output (or main) channel portion 80, a p-type drain extension 82, a heavily doped p-type main drain portion 84, a silicon oxide gate dielectric layer 85, and a p-type polysilicon gate electrode 86. Input channel portion 78 is more heavily doped than output channel portion 80. Drain extension 82 is more lightly doped than main drain portion 84.

A partially recessed field-oxide region 88 and a lightly doped p-type (100) silicon semiconductive substrate 89 are also shown in FIG. 10. For n-channel FET 40, FIGS. 10a and 10b together show how threshold body region 53 encloses n++ source zone 44 up to field oxide region 89. FIGS. 10a and 10c together similarly depict how LDD extension 50 encloses n++ main drain portion 52 up to field oxide 89. Heavily doped p-type regions 90 act as channel stops for preventing inversion of device region 54 along the bottom of field oxide 89. FIGS. 12a–12l (collectively "FIG. 12") illustrate a cross-sectional view of a portion of a silicon wafer during various steps to create the CMOS structure of FIG. 10 according to a VLSI process in accordance with the teachings of the invention. A 2-$\mu$m minimum feature-size (gate length) is used in this VLSI CMOS process. The process could be scaled down to at least a 0.5-$\mu$m minimum feature size, with appropriate changes in the metallurgical profiles if digital VLSI applications are sought where the supply voltage is typically 3.3 or 5 V. On the other hand, the 2-$\mu$m minimum feature size can be maintained or increased, and the drain zones can be redesigned, if the CMOS structure of FIG. 10 is to be used in analog and mixed signal applications requiring higher supply voltage capability.

Referring to FIG. 12a, the starting point is p-substrate 89 whose doping concentration is typically $5 \times 10^{14}$ atoms/cm$^3$. Substrate 89 may include an underlying heavily doped p-type substructure (not shown). A pad layer 92 of silicon oxide is thermally grown along the upper surface of p-substrate 89. A layer 94 of silicon nitride is deposited on pad oxide 92.

Using a photoresist mask 96, a portion of nitride layer 94 is removed above the location for n device region 72 as shown in FIG. 12b. Phosphorus ions 98 are implanted through the exposed part of pad oxide 92 and into substrate 89 to define n device region 72. Photoresist 96 is subsequently removed.

In FIG. 12c, the wafer is placed in thermal oxidizing atmosphere to grow a relatively thick layer 102 of silicon oxide along the portion of the upper silicon surface not covered by the remainder 94A of nitride 94. Nitride layer 94A prevents silicon oxide from growing under nitride 94A. N device region 72 diffuses further into substrate 89 during this step, and the implanted phosphorus is activated, thereby providing the main body region for p-channel FET. After completion of subsequent high-temperature process steps, the final surface dopant concentration of n main body region 72 is approximately $5 \times 10^{15}$ atoms/cm$^3$.

Nitride 94A is removed as indicated in FIG. 12d. Boron ions 104 are implanted through the remainder 92A of pad oxide 92 and into the underlying part of substrate 89 to define p device region 54. Thick oxide 102 prevents boron ions 104 from being implanted into n device region 72.

Thick oxide 102 is stripped as indicated in FIG. 12e. A new layer 106 of silicon oxide is grown over the surface of the wafer. A layer 108 of silicon nitride is deposited over oxide layer 106. Nitride 108 and oxide 106 are patterned using conventional photolithographic methods to expose parts of n device region 72 and p device region 54. Using a photoresist mask (not shown) that covers n device region 72, boron is ion implanted into p device region 54 to form self-aligned p-type channel stop regions 90.

In FIG. 12f, the wafer is placed in a thermal oxidizing atmosphere to grow field oxide 88 along the exposed part of the upper silicon surface. The implanted phosphorus and boron are driven deeper into substrate 89 during this step. Device regions 54 and 72 thereby expand downward. The implanted boron that defines p device region 54 is activated, thereby providing the main body region for n-channel FET 40. After completion of subsequent high-temperature fabrication steps, the final surface dopant concentration of p main body region 54 is approximately $5 \times 10^{15}$ atoms/cm$^3$.

Nitride 108 and oxide 106 are removed. See FIG. 12g. A sacrificial oxide layer is thermally grown along the exposed silicon and then removed. A gate oxide layer 110 is thermally grown along the exposed silicon.

A layer of polysilicon is deposited on top of the wafer. The polysilicon is masked and etched using conventional photolithographic processes to form gate electrodes 48 and 86. The wafer is then oxidized to form thin sealing layers 116 of silicon oxide over polysilicon gate electrodes 48 and 86.

In FIG. 12h, a non-critical photoresist mask 118 is formed over the wafer so as to cover the intended locations for n+ LDD extension 50 and n+ threshold body zone 76. Using (a) photoresist 118, (b) gate electrodes 48 and 86, and (c) the portions of oxide 116 along the sides of electrodes 48 and 86 as an implant shield, boron ions 120 are implanted through gate oxide 110 into unshielded portions of device regions 54 and 72 to simultaneously define (a) precursor p+ threshold body zone 53 for n-channel FET 40 and (b) precursor p+ drain extension 82 for p-channel FET 70. Thus, p+ threshold body zone 53 is formed with no additional steps beyond those needed to create p+ drain extension 82. Photoresist 118 is subsequently removed.

Another non-critical photoresist mask 122 is formed over the wafer so as to cover p+ threshold body zone 53 and p+ LDD extension 82. See FIG. 12i. Using (a) photoresist 122, (b) gate electrodes 48 and 86, and (c) the side portions of oxide 116 as an implant shield, phosphorus ions 124 are implanted through gate oxide 110 into unshielded portions of device regions 54 and 72 to simultaneously define (a) precursor n+ drain extension 50 for n-channel FET 40 and (b) precursor n+ threshold body zone 76 for p-channel FET 70. Accordingly, n+ threshold body zone 76 is formed with no additional steps beyond those needed to form n+ drain extension 50. Photoresist 122 is then removed.

The doping levels utilized during the two implants are typically chosen so as to provide each of FETs 40 and 70 with a threshold voltage having a magnitude of 0.9 V for a 2-$\mu$m minimum feature size. At the same time, the net dopant concentration in surface-peaked LDD extensions 50 and 82 and in surface-peaked threshold body zones 53 and 76 is approximately $0.9 \times 10^{17}$ atoms/cm$^3$.

Figure 12I:
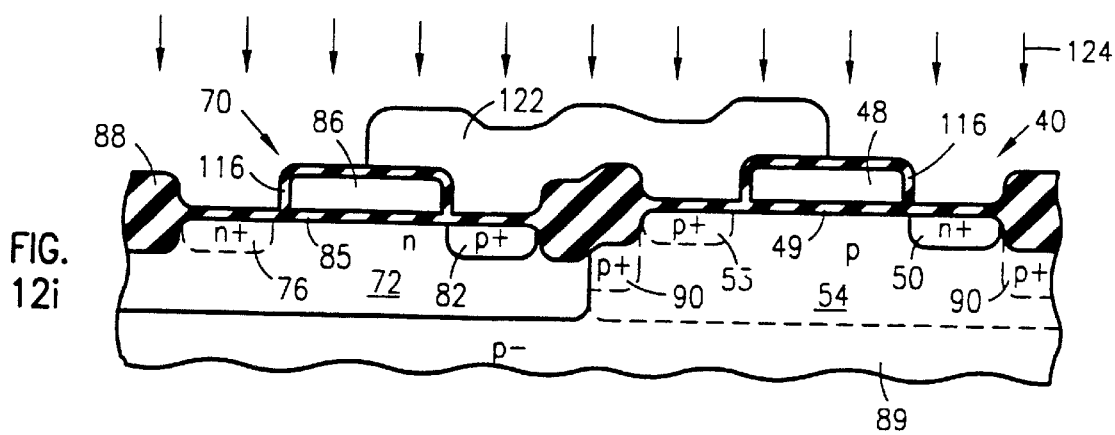
Figure 12J:
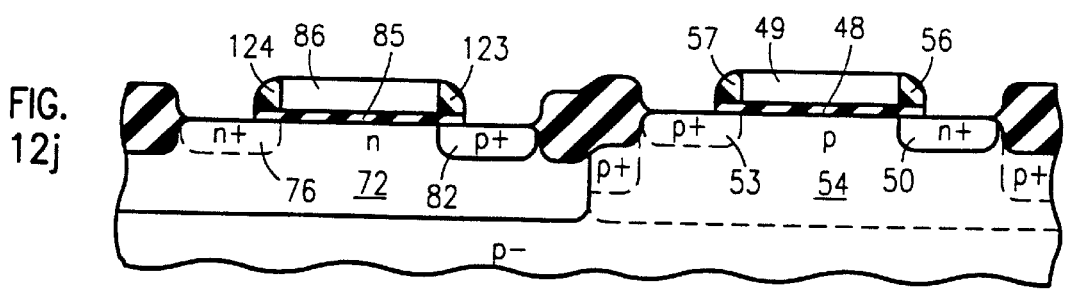

In FIG. 12j, a layer of low-temperature oxide is conformally deposited on top of the structure and anisotropically etched to form oxide sidewall spacers 56 and 57 along the sides of gate electrode 48. Oxide sidewall spacers 123 and 124 are simultaneously formed along the sides of gate electrode 86. Spacers 56, 57, 123, and 124 are considerably thicker (in the lateral direction) than sealing oxide 116. The remainder of gate oxide 110 constitutes gate dielectric layers 49 and 85.

Figure 12K:
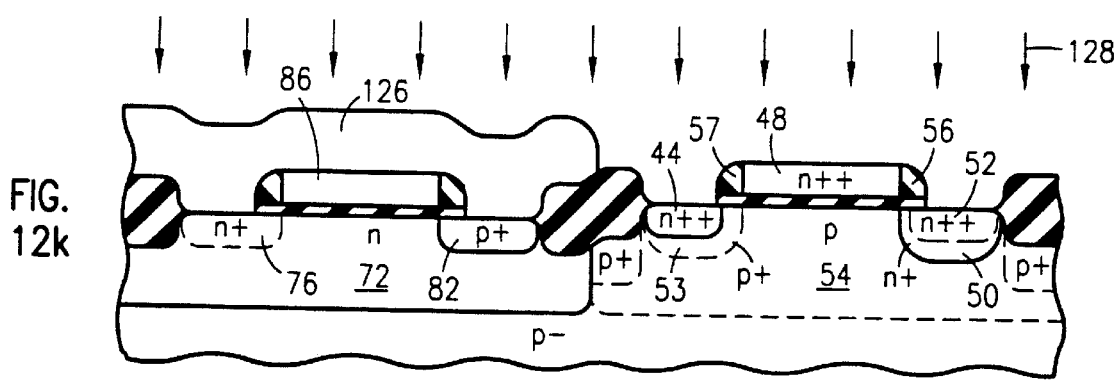

A non-critical photoresist mask 126 is formed over p-channel transistor 70, leaving n-channel transistor 40 exposed See FIG. 12k. Using gate electrode 48 and spacers 56 and 57 as an implant shield, arsenic ions 128 are implanted at a high dosage into the exposed areas of device region 54 to define n++ source zone 44 and n++ main drain portion 52. In the preferred embodiment, the n++ source/drain profiles are described by Gaussian functions so as to result in source/drain junction depths of approximately 0.35 $\mu$m at surface dopant concentrations of $10^{20}$ atoms/cm$^3$ for a 2-$\mu$m minimum feature size. Polysilicon gate electrode 48 is also doped heavily n-type during the arsenic implantation. Photoresist 126 is subsequently removed.

Figure 12L:
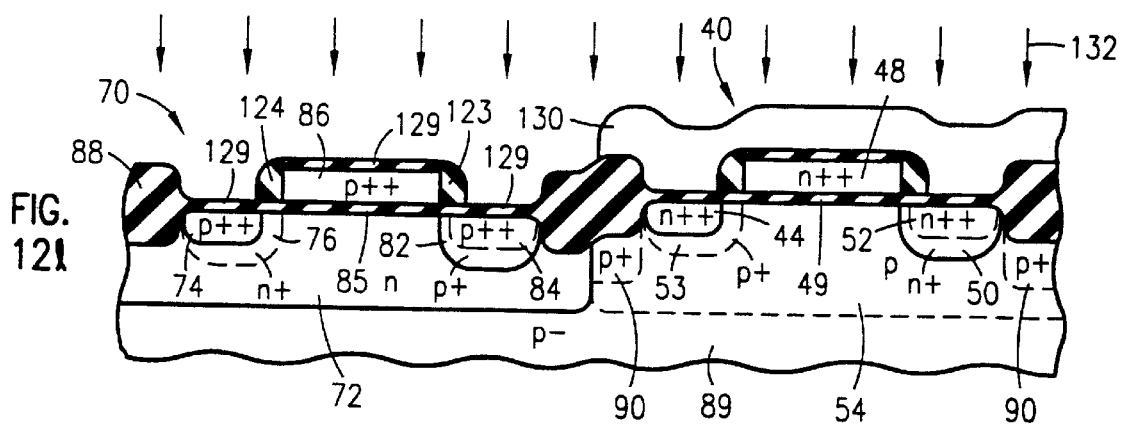

Thin sealing layers 129 of silicon oxide are thermally grown along the upper surfaces of the exposed silicon areas as indicated in FIG. 12l. A non-critical photoresist mask 130 is formed over n-channel FET 40, leaving p-channel FET 70 exposed. Using gate electrode 86 and spacers 123 and 124 as an implant shield, boron ions 132 are implanted through sealing oxide layers 129 into unshielded portions of n device region 72 at a high dosage to define p++ source zone 74 and p++ main drain portion 84. Analogous to n-channel FET 40, source/drain junction depths of approximately 0.35 $\mu$m at surface dopant concentrations of $10^{20}$ atoms/cm$^3$ are preferably obtained for FET 70 at a 2-$\mu$m minimum feature size with p++ source/drain profiles defined by Gaussian functions. Polysilicon gate electrode 86 is also doped heavily p-type during this boron implantation.

The source/drain junction depth for both of FETs 40 and 70 must be sufficiently great that source zones 44 and 74 diffuse close enough, preferably slightly under, respective gate electrodes 48 and 86 during subsequent high-temperature processing so that electrodes 48 and 86 are respectively capable of controlling the operation of FETs 40 and 70. Since lateral dopant diffusion distance is roughly 75% of vertical dopant diffusion distance, the source/drain junction depth dj should satisfy the relationship:

$$d_J \geq w_{SP}/0.75 \qquad (3)$$

where $w_{SP}$ is the spacer width. For a 0.25-$\mu$m spacer width, Eq. 3 is satisfied with the 0.35-$\mu$m source/drain junction depth in FETs 40 and 70 for a process with a 2-$\mu$m minimum feature size.

To permit implantation into the silicon of FET 40, the thickness of sealing oxide layers 129 should not be much greater than that required to cure damage resulting from the high-dosage arsenic source/drain implant. On the other hand, the high-dosage boron implant and subsequent thermal processes must be controlled so that the implanted boron does not go through p++ gate electrode 86 and into the underlying channel of FET 70.

Compared to the n-type and p-type dopant concentrations produced in gate electrodes 48 and 86 during the high-dosage arsenic and boron source/drain implants, electrodes 48 and 86 do not receive any significant doping prior to those implants. Accordingly, the high-dosage arsenic and boron source/drain implants determine the work functions for electrodes 48 and 86. Importantly, complementary doped gate electrodes 48 and 86 provide better symmetry between CMOS transistors 40 and 70.

In completing fabrication of the CMOS device, photoresist mask 130 is removed. The resulting structure is that of FIG. 10a. A layer of low-temperature oxide (not shown) is deposited on top of the structure and reflowed to planarize the upper dielectric surface. During the reflow, zones 52, 50, 44, 53, 84, 82, 74, and 76 expand to the positions shown in FIG. 10a. All non-activated p-type and n-type dopants become activated. Metallization (not shown) and passivation are performed after the reflow.

Computer simulations fully confirmed the gains achieved with the invention and revealed additional improvements in the transistor driving capability and gate-drain transfer linearity. In addition to the calculated performances, the present FET device structures and fabrication process are expected to yield improved speed performance. Compared to a conventional CMOS process, the present manufacturing process is simpler because it avoids the necessity for a separate threshold adjust step.

The threshold body and LDD implants can be applied at low energy for obtaining surface-peaked profiles, or at higher energies for obtaining subsurface-peaked profiles. The subsurface-peaked dopant profiles result in essentially the same current-voltage characteristics as those of the surface-peaked dopant profiles and produce substantial additional improvements in hot-carrier characteristics.

Computer simulations were conducted on LDD FET structures having two-part channel zones configured according to the invention. The simulations were performed to a depth of 2 $\mu$m below the upper monocrystalline silicon surface using parameters of a process having a 2-$\mu$m minimum feature size. Device region 54 (for n-channel FETs) or 72 (for p-channel FETs) was assumed to be uniformly doped at a concentration of 5×$10^{15}$ atoms/cm$^3$. This is an approximation to the actual device region vertical dopant concentration profile whose magnitude, near the upper semiconductor surface, decreases slowly in going downward.

In the following description, each reference to a "surface-peaked" FET means an FET having a surface-peaked LDD extension and a surface-peaked threshold body zone. Likewise, each reference to a "subsurface-peaked" FET means an FET having a subsurface-peaked LDD extension and a subsurface-peaked threshold body zone.

FIG. 13 illustrates the longitudinal/vertical dimensional profile of the monocrystalline silicon portion of an embodiment of surface-peaked n-channel FET 40 examined during the computer simulations. Only pn junctions appear in FIG. 13. Accordingly, p threshold body zone 53 is not separately shown in FIG. 13. Likewise, the transition from n++ main drain portion 52 to n+ drain extension 50 is not shown in FIG. 13.

FIGS. 14.1–14.4 (collectively "FIG. 14")present computer representations of the dopant concentration profile for the embodiment of surface-peaked n-channel FET 40 in FIG. 13. The numerical portions of the starred reference symbols in FIG. 14 indicate the like-numbered regions in FIGS. 5 and 13. The three-dimensional dopant profile is shown in FIG. 14.1. FIG. 14.2 illustrates the longitudinal two-dimensional dopant profile along the upper silicon surface. Vertical dopant profiles through source zone 44 at distance equal to zero and through drain zone 50/52 at distance equal to 3 $\mu$m are respectively shown in FIGS. 14.3 and 14.4.

In the example of FIGS. 13 and 14, main drain zone 52 and drain extension 50 extended to almost the same depth into device region 54. Source zone 52 and main drain zone each had a length of approximately 0.5 $\mu$m in the direction of the channel. In the following discussion of the computer simulations, all references to n-channel FET 40 mean embodiments of surface-peaked FET 40 mean embodiments of surface-peaked FET 40 having the dimensional (longitudinal and vertical) characteristics of FIG. 13 and the dopant profile of FIG. 14.

A surface-peaked p-channel FET having the same dimensional characteristics as shown in FIG. 13 was also examined during the simulations. The dopant profile of an embodiment of p-channel FET 70 examined in the simulations was essentially the same as that of n-channel FET 40, except for possibly small differences in the doping of n+ threshold body zone 76 in FET 70, as adjusted experimentally for threshold matching. All references to p-channel FET 70 in the discussion of the computer simulations means an embodiment of surface-peaked p-channel FET 70 having p-channel characteristics equivalent to the n-channel characteristics shown in FIGS. 13 and 14.

Electrical simulations were done with the Medici two-dimensional semiconductor device simulation program available from Technology Modeling Associates. The Medici enhanced surface mobility model SRFMOB2 was used in conjunction with (a) the concentration-dependent mobility model CONMOB at low electric fields and (b) the field-dependent mobility model FLDMOB at high electric fields. The impact ionization generation was employed during all the simulations. The band-to-band tunneling was generally not employed in the simulations after several simulations showed no significant difference in the results between cases in which the band-to-band tunneling was used and cases in which it was turned off. The interface fixed charge density was set at $1 \times 10^{10}$ elementary charges/cm$^2$ in the simulations. A value of 0.1 $\mu$s was used for the recombination-generation lifetime for both electrons and holes. The concentration-dependent recombination model was used with Medici parameter NSRHN equal to $4 \times 10^{17}$ atoms/cm$^3$.

The n-channel FETs of the invention were compared to a reference conventional non-LDD n-channel FET having the same source/drain dimensional characteristics as the inventive FET structure of FIG. 13. The background (or substrate) dopant concentration in the reference non-LDD n-channel FET was $3 \times 10^{16}$ atom/cm$^2$ so that both n-channel FETs of the invention and the reference non-LDD n-channel FET had a threshold voltage of approximately 0.9 V.

For drain voltage $V_D$ equal to 0.1 V, FIG. 15.1 illustrates how drain current $I_D$ varies with gate voltage $V_G$ in n-channel FET 40 compared to the reference non-LDD n-channel FET. As FIG. 15.1 shows, n-channel FET 40 turned on more abruptly than the reference n-channel FET. This is advantageous.

For a $V_D$ value of 5 V that produced a drain saturation condition, FIG. 15.2 shows the variation of drain current $I_D$ with gate voltage $V_G$ for n-channel FET 40 compared to the reference n-channel FET. Advantageously, the $I_D$–$V_G$ curves at gate voltage $V_G$ greater than the 0.9–V threshold voltage were more linear for n-channel FET 40 than the reference n-channel FET.

The advantages of improved turn-on characteristics and improved linearity at the drain saturation condition occur with p-channel FET 70 of the invention. For a $V_D$ value of –0.1 V, FIG. 16 illustrates how drain current $I_D$ varies with drain voltage $V_D$ for p-channel FET 70 compared to the reference non-LDD p-channel FET. FIG. 16 shows that p-channel FET 70 turned on more abruptly than the reference p-channel FET.

Figure 1:
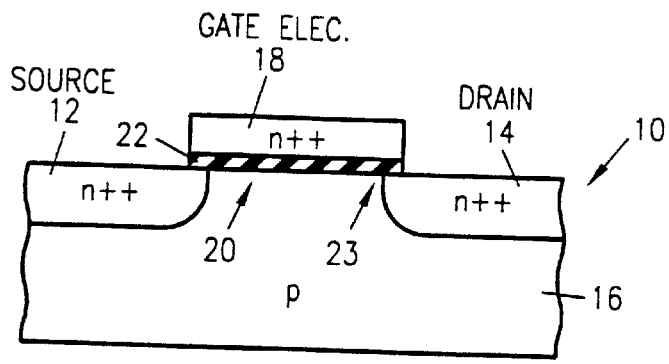
FIG. 1 is a cross-sectional view of a conventional n-channel integrated MOS transistor.

Insofar as hot-carrier generation is concerned, the worse-case condition for n-channel FETs occurs when gate voltage $V_G$ is zero and drain voltage $V_D$ is at the supply voltage— i.e., 5 V. For these worse-case conditions, FIGS. 17.1 and 17.2 present three-dimensional representations that respectively illustrate how the electric field varies with depth and longitudinal distance for n-channel FET 40 and the reference non-LDD n-channel FET. In both FETs, the maximum electric field occurs along the upper silicon surface where the channel zone terminates at the drain junction. This is point 23 in FIG. 1 for the reference n-channel FET and point 140 in FIG. 13 for n-channel FET 40 of the invention. As FIGS. 17.1 and 17.2 show, the maximum electric field is considerably lower in n-channel FET 40 than in the reference n-channel FET. Accordingly, the magnitude of hot-carrier generation is reduced in the invention.

Up to this point, each of the reference FETs has been a non-LDD device. Comparisons to reference LDD FETs were also made during the computer simulations.

Figure 2:
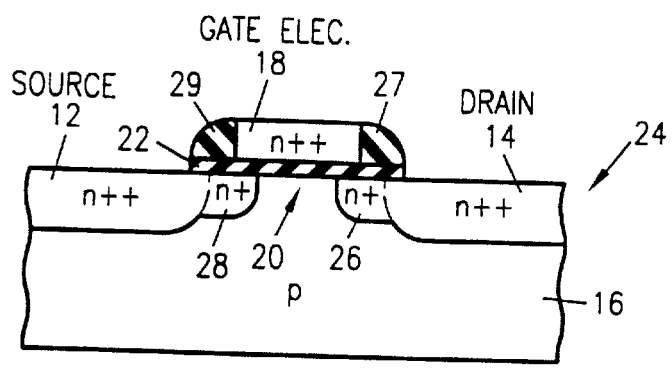
FIG. 2 is a cross-sectional view of a conventional n-channel integrated MOS transistor having symmetrical lightly doped n-type drain and source extensions.
Figure 3:
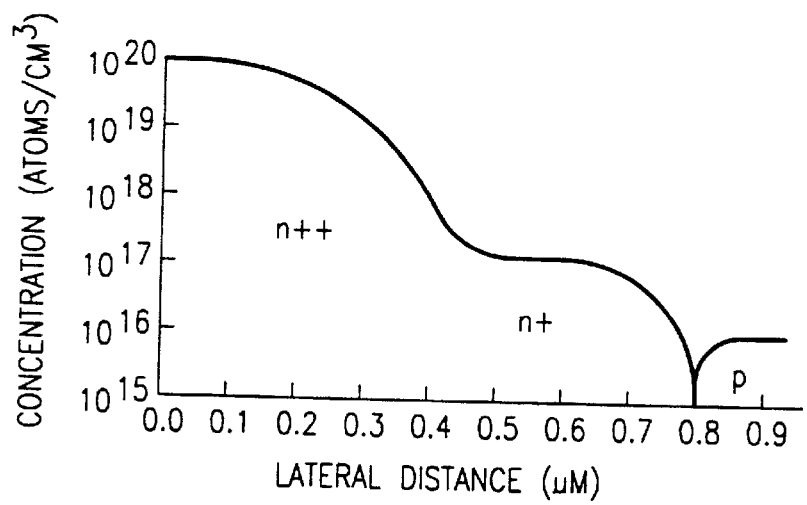
FIG. 3 is a dopant profile along the upper semiconductor surface for the FET structure of FIG. 2.
Figure 4:
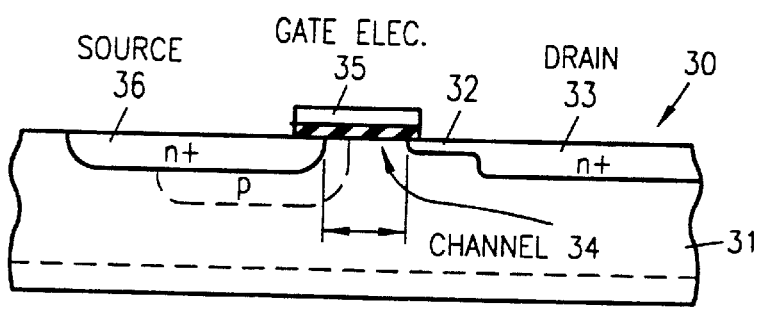
FIG. 4 is a cross-sectional view of a discrete high-voltage prior art n-channel MOS transistor having a lightly doped n-type drain extension and a local p-type body region doped more heavily doped than the p-type substrate.

For the worse-case scenario in an analog integrated circuit at gate voltage $V_G$ equal to zero and drain voltage $V_D$ equal to 10 V, FIGS. 18.1 and 18.2 respectively illustrate equipotential lines for n-channel FET 40 and a conventional LDD FET of the type shown in FIG. 2. The difference in potential between adjacent lines in FIGS. 18.1 and 18.2 is 0.5 V.

In order for n-channel FET 40 to achieve substantially the same threshold voltage as the reference LDD n-channel FET, n-channel FET 40 as simulated in FIG. 18.1 had a main body dopant concentration of $5 \times 10^{15}$ atoms/cm$^3$, a maximum LDD/threshold-body surface dopant concentration of $0.9 \times 10^{17}$ atoms/cm$^3$, and a Gaussian length characteristic of 0.2 $\mu$m for the LDD/threshold-body profile, whereas the reference LDD n-channel FET simulated in FIG. 18.2 had a main body dopant concentration of $3 \times 10^{16}$ atoms/cm$^3$, a maximum LDD surface dopant concentration of $1 \times 10^{18}$ atoms/cm$^3$, and a Gaussian length characteristic of 0.1 $\mu$m for the LDD profile. Examination of FIGS. 18.1 and 18.2 shows that the equipotential lines are less crowded where output channel portion 46 meets LDD extension 50 in n-channel FET 40 than where channel region 20 meets LDD extension 26 in the reference LDD n-channel FET. This illustrates the fact that the electric field along the upper semiconductor surface where the drain terminates the channel is lower in the two-part channel LDD n-channel FET of the invention than in the conventional LDD n-channel FET.

Analogous to FIG. 13, FIG. 19 illustrates the longitudinal/vertical dimensional profile of the monocrystalline silicon portion of an embodiment of subsurface-peaked n-channel FET 60 of FIG. 9 examined during the computer simulations. Since only pn junctions appear in FIG. 19, threshold body zone 66 is not shown in FIG. 19. Likewise, the transition from n++ main drain portion 52 to n+ drain extension 68 is not shown. The maximum dopant concentrations for threshold body zone 66 and LDD extension 68 in FIG. 19 occur at a depth of 0.2 $\mu$m into device region 54.

FIGS. 20.1–20.4 (collectively "FIG. 20") present computer representations of the dopant concentration profile for the embodiment of n-channel FET 60 in FIG. 19. The numerical portions of the starred reference symbols in FIG. 20 indicate the like-numbered silicon regions in FIG. 9. The three-dimensional dopant profile is illustrated in FIG. 20.1. FIG. 20.2 shows the longitudinal two-dimensional dopant profile along the upper semiconductor surface. The vertical dopant profiles through source zone 44 and drain zone 52/68 are respectively depicted in FIGS. 20.3 and 20.4 at distances respectively equal to zero and 3 $\mu$m in FIG. 19. All references to n-channel FET 60 in the remaining portion of the discussion of the computer simulations means the embodiment of subsurface-peaked n-channel FET 60 having the characteristics shown in FIGS. 19 and 20.

When an insulated-gate FET is in saturation, drain current $I_D$ is given as:

$$I_D = I_{DSAT} + I_{SUB} \qquad (4)$$

where $I_{DSAT}$ is the drain saturation current flowing through the FET's channel, and $I_{SUB}$ is the substrate current flowing from the drain to the substrate (contact). Saturation current $I_{DSAT}$ increases very slowly with increasing drain voltage $V_D$ when the FET is in saturation. Substrate current $I_{SUB}$ is ideally close to zero. Current $I_{SUB}$ is a good indicator for the presence of undesired hot-carrier generation because current flows from the drain to the substrate only when there is impact ionization.

FIG. 21.1 illustrates how drain current $I_D$ varies with drain voltage $V_D$ at gate voltage $V_G$ equal to 5 V for four FETs: (a) surface-peaked n-channel FET 40, (b) subsurface-peaked n-channel FET 60, (c) the reference non-LDD FET and (d) the reference LDD n-channel FET. The variation of substrate current $I_{SUB}$ with drain voltage $V_D$ is indicated in the lower right-hand corner of FIG. 21.1. FIG. 21.2 is an expanded view of the $I_{SUB}$ part of FIG. 21.1.

As expected, FIGS. 21.1 and 21.2 (collectively "FIG. 21")illustrate that substrate current $I_{SUB}$ is lower in the n-channel FETs because holes have much lower ionization rates than electrons.

The drain breakdown voltage $V_{DB}$ for surface-peaked n-channel FET 40 in the simulations was approximately 16 volts compared to 13.5–14 V for the reference non-LDD n-channel FET. This is a 15–20% improvement. Breakdown voltage $V_{DB}$ for subsurface-peaked n-channel 60 was nearly 18 V, amounting to approximately a 30% improvement over the reference non-LDD n-channel FET.

A summary of the main parameter values used in the simulations is given in Table II below:

TABLE II

| Parameter Units | Main Body Doping atoms/cm³ | LDD Peak Doping atoms/cm³ | LDD Gauss Length Charact. µm | Source/Drain Peak Conc. Depth µm | Source/Drain Peak Doping atoms/cm³ | Source/Drain Junct. Depth µm | Spacer Width µm |
|---|---|---|---|---|---|---|---|
| N-chan. FET 40 | $5 \times 10^{15}$ | $0.9 \times 10^{17}$ | 0.20 | 0.00 | $1 \times 10^{20}$ | 0.35 | 0.25 |
| P-chan. FET 70 | $5 \times 10^{15}$ | $0.9 \times 10^{17}$ | 0.20 | 0.00 | $1 \times 10^{20}$ | 0.35 | 0.25 |
| N-chan. FET 60 | $5 \times 10^{15}$ | $1.3 \times 10^{17}$ | 0.20 | 0.20 | $1 \times 10^{20}$ | 0.35 | 0.25 |
| N-chan. Non-LDD Ref. | $3 \times 10^{16}$ | — | — | — | $1 \times 10^{20}$ | 0.35 | — |
| P-chan. Non-LDD Ref. | $3 \times 10^{16}$ | — | — | — | $1 \times 10^{20}$ | 0.35 | — |
| N-chan. LDD Ref. | $3 \times 10^{16}$ | $1.0 \times 10^{18}$ | 0.10 | 0.20 | $1 \times 10^{20}$ | 0.35 | 0.25 | reference LDD n-channel FET than in the reference non-LDD n-channel FET. Importantly, current $I_{SUB}$ for surface-peaked FET 40 of the invention is much less than for the reference LDD FET. In particular, FET 40 provides a four-fold reduction in current $I_{SUB}$ over the reference LDD FET. As FIG. 21 indicates, subsurface-peaked n-channel FET 60 of the invention achieves even greater reduction in current $I_{SUB}$. FIG. 21 shows that current $I_{SUB}$ in FET 60 is over 20 times lower than in the reference LDD FET.

Figure 22:
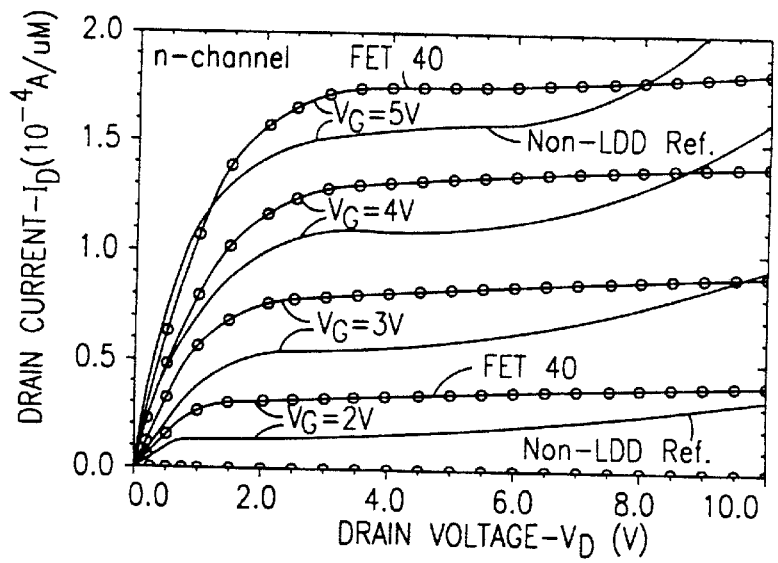
FIG. 22 is a graph of drain current as a function of drain voltage at various gate-voltage values for (a) the n-channel FET implemented in FIGS. 13/14 and (b) the reference non-LDD n-channel FET.

FIG. 22 illustrates the output $I_D$–$V_D$ characteristics at various values of gate voltage $V_G$ for surface-peaked n-channel FET 40 compared to the reference non-LDD n-channel FET. Across the entire $V_G$ range from zero to 10 V, the $I_D$ curves for n-channel FET 40 are flatter than the corresponding $I_D$ curves for the reference non-LDD n-channel FET. This indicates that FET 40 has a higher output resistance so that drain current $I_D$ is closer to saturation current $I_{DSAT}$. Consequently substrate current $I_{SUB}$ is lower for FET 40, leading to reduced hot-carrier generation.

Figure 23:
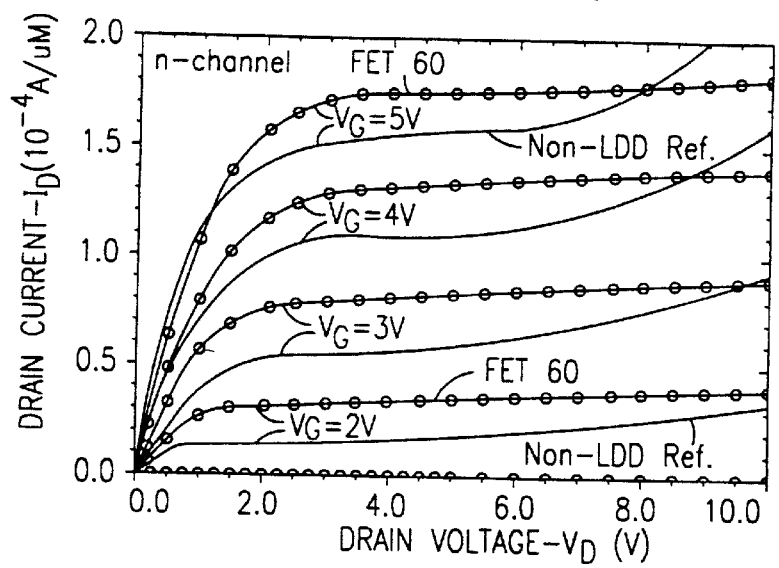
FIG. 23 is a graph of drain current as a function of drain voltage at various gate-voltage values for (a) the n-channel FET implemented in FIGS. 19/20 and (b) the reference non-LDD n-channel FET.

The corresponding output $I_D$–$V_D$ curves for sub-surface peaked n-channel FET 60 of the invention compared to the reference non-LDD n-channel FET at the same $V_G$ value are depicted in FIG. 23. The $I_D$ curves for FET 60 are slightly flatter than the corresponding $I_D$ curves for FET 40, indicating that FET 60 has even higher output resistance and thus should have even less difficulty with hot-carrier generation.

Figure 24:
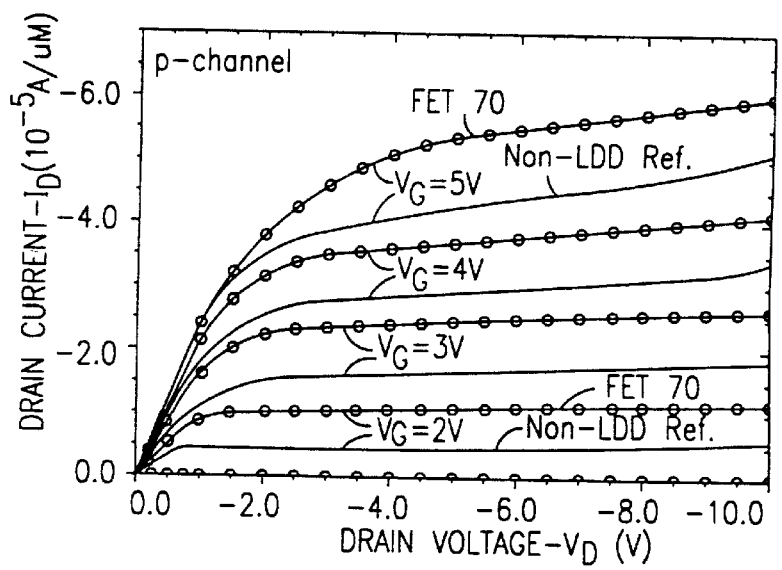
FIG. 24 is a graph of drain current as a function of drain voltage at various gate-voltage values for (a) the p-channel FET having characteristics of the type shown in FIGS. 13/14 and (b) the reference non-LDD p-channel FET.

FIG. 24 depicts the output $I_D$–$V_D$ characteristics at the same $V_G$ values for surface-peaked p-channel FET 70 compared to the reference non-LDD p-channel FET. Although the magnitude of drain current $I_D$ at a given $V_D$ magnitude is less in the p-channel case than in the n-channel case, the $I_D$ curves for p-channel FET 70 are flatter than the corresponding $I_D$ curves for the reference non-LDD p-channel FET across the entire $V_G$ range from zero to –10 V. With respect to the reduced $I_D$ magnitude in the p-channel FETs, the effect of impact ionization for the range of $V_D$ values considered is less critical in p-channel FETs than in For FETs 40, 70, and 60 of the invention, the LDD values are also the values for the threshold body zones containing the input channel portions. All other parameter values were the same for all the preceding FETs, including the reference FETs.

The electrical parameters of an LDD FET having the two-part channel zone of the invention depend, as indicated above, on the doping profiles in the two body regions of the FET structure. If the input channel is sufficiently long, the threshold voltage $V_T$ is controlled by the maximum doping concentration $N_{THB,MAX}$ of threshold body zone (53, 66, or 76). A correction coefficient $\alpha_{TH}$, which is less than 1, is applied to dopant concentration $N_{THB,MAX}$ to account for the small width of the threshold body zone in narrow-peaked profiles. For an n-channel MOS transistor created from silicon, the threshold voltage $V_T$ is given from:

$$V_T = V_{FB} + 2\phi_{Fp} + \sqrt{\frac{2K_s\varepsilon_0 q(\alpha_{TH}N_{THB,MAX}) \cdot (2\phi_{Fp})}{C_0}} \quad (5)$$

$$\phi_{Fp} = \frac{kT}{q}\ln\frac{N_{THB,MAX}}{n_i} \quad (6)$$

where $V_{FB}$ is the flat-band voltage, $K_s$ is the relative dielectric constant of silicon, $\varepsilon_0$ is the permittivity of free space, $\alpha_{TH}$ is an empirical constant, $C_0$ is the gate dielectric capacitance per unit area, q is the electronic charge, k is Boltzmann's constant, T is the absolute temperature, and $n_i$ is the intrinsic carrier concentration in silicon. Empirical constant $\alpha_{TH}$ approaches one for threshold channels longer than 1 µm.

In the simulations, the 0.9-V threshold voltage of the non-LDD reference n-channel FET having a background (main body) doping of $3 \times 10^{16}$ atoms/cm³ was matched by n-channel FET 40 having $N_{THB,MAX}$ equal to $1 \times 10^{17}$ atoms/cm³. Applying Eqs. 5, and 6 to FET 40, and their counterparts to the reference n-channel FET, yields a value of 0.36 for $\alpha_{TH}$.

The drain saturation voltage $V_{DSAT}$ is determined as the voltage at which the channel is extinguished, at its drain end, by application of the drain voltage. Since the background doping around the drain termination of the channel is the main body doping, saturation voltage $V_{DSAT}$ is controlled by the main body doping $N_B$ according to the classical equation for a long-channel FET:

$$V_{DSAT} = V_G - V_{FB} - 2\phi_{FP} - \frac{K_s \varepsilon_0 q N_B}{C_0^2} \left[ \sqrt{1 + \frac{2C_0^2(V_G - V_{FB})}{K_s \varepsilon_0 q N_B}} - 1 \right] \quad (7)$$

The body concentration of a conventional MOS transistor is greater than $N_B$ (e.g., $3 \times 10^{16}$ atoms/cm$^3$ versus $5 \times 10^{15}$ atoms/cm$^3$). Therefore, the saturation voltage $V_{DSAT}$ for the two-part channel FET of the invention is slightly greater than that of a conventional FET designed for the same threshold voltage. The $I_D$–$V_D$ curves in FIGS. 22–24 confirm this conclusion. The use of a more lightly doped substrate for the output channel, compared to the substrate of a conventional MOS FET, advantageously allows the electric field structure to be relaxed at the drain end of the channel zone and also provides a more efficient and faster device turn on.

The presence of thin gate oxide above the channel zone provides protection against punch-through since the gate oxide forces the electric field to concentrate between the gate electrode and the drain zone, back from the main body region where the maximum electric field would otherwise occur. FIG. 18.1 illustrates this effect. Hence, in most practical cases, the gate oxide breaks down before punch-through occurs.

In general, the punch-through situation is by far avoided when the FET gate length L exceeds the value of the depletion layer width $W_d$ in a single-sided pn junction built on the main body material. This is expressed as:

$$L \geq W_d(V_{DMAX}) = \sqrt{\frac{2K_s \varepsilon_0 V_{DMAX}}{qN_B}} \quad (8)$$

where $V_{DMAX}$ is the maximum voltage specification for the drain electrode. This condition is satisfied for the 2–$\mu$m demonstration vehicles considered in our simulations where the drain depletion width $W_d$ was 1.7 $\mu$m at a 10-volt $V_{DMAX}$.

While the invention has been described with reference to particular embodiments, this description is solely for the purpose of illustration and is not to be construed as limiting the scope of the invention claimed below. For example, the depth of the drain extensions in CMOS embodiments of the invention could be less than the depth of the heavily doped main portions of the drains.

Device regions 54 and 72 could be defined by separate masks rather than by using the self-aligned technique described above. By appropriately increasing the doping of p-type substrate 89, p-type device region 54 could simply consist of part of substrate 89 without introducing any additional p-type dopant into substrate 89 to establish the doping level for device region 54. Alternatively, substrate 89 could consist of lightly doped n-type material rather than lightly doped p-type material.

Field-isolation structures such as SWAMI and trench isolation could be used in place of partially recessed field oxide 88. Although extensive simulations and calculations have been made to verify the validity of the present device structures and process using 2-$\mu$m gate-length demonstration vehicles, the concepts of the invention can be applied, with proper design optimization, to a wide range of CMOS processes. The invention is particularly applicable to high voltage digital and analog applications that can capitalize on improved hot-carrier reliability, speed and transconductance linearity, without requiring total source/drain symmetry.

The FETs of the invention could be combined with bipolar transistors for manufacture in a BiCMOS process. Instead of using spacers to define the positions of the source zones and the main drain portions relative to the respective positions of the threshold body zones and the drain extensions, photolithography could be used. The doping steps could be performed in a different order than that described above. Accordingly, various modifications and applications may be made by those skilled in the art without departing from the true scope and spirit of the invention as defined in the appended claims.

I claim:

1. A structure comprising:
   a device region of a first conductivity type situated in a semiconductive body;
   source and drain zones of a second conductivity type opposite to the first conductivity type situated in the semiconductive body along its upper surface and laterally separated by a channel zone of the device region, the drain zone comprising a main drain portion and a more lightly doped drain extension located between the channel zone and the main drain portion, the drain extension substantially extending at least as deep into the semiconductive body as the main drain portion and fully surrounding the main drain portion along its outside surface within the material of the semiconductive body, the channel zone comprising an output channel portion and a more heavily doped input channel portion that respectively meet the drain extension and the source zone, the input channel portion being part of a source-adjoining threshold body zone of the first conductivity type substantially extending at least as deep into the semiconductive body as the source zone, each of the threshold body zone and the drain extensional reaching a maximum net dopant concentration at a depth of at least 0.05 $\mu$m into the semiconductive body; and
   a gate electrode situated above the channel zone, vertically separated from the channel zone by gate dielectric material, and extending partially over both the drain extension and the main drain portion.

2. A structure as in claim 1 wherein the threshold body zone fully surrounds the source zone along its outside surface within the material of the semiconductive body.

3. A structure as in claim 1 wherein each of the threshold body zone and the drain extension has a maximum net dopant concentration of $5 \times 10^{16}$–$5 \times 10^{17}$ atoms/cm$^3$.

4. A structure as in claim 3 wherein each of the source zone and the main drain portion has a maximum net dopant concentration of $5 \times 10^{19}$–$2 \times 10^{20}$ atoms/cm$^3$.

5. A structure comprising:
   a device region of a first conductivity type situated in a semiconductive body;
   source and drain zones of a second conductivity type opposite to the first conductivity type situated in the semiconductive body along its upper surface and laterally separated by a channel zone of the device region, the drain zone comprising a main drain portion and a more lightly doped drain extension located between the channel zone and the main drain portion, the drain extension substantially extending at least as deep into the semiconductive body as the main drain portion, the channel zone comprising an output channel portion and a more heavily doped input channel portion that respectively meet the drain extension and the source zone, the input channel portion being part of a source-adjoining threshold body zone of the first conductivity type substantially extending at least as deep into the semiconductive body as the source zone, each of the threshold body zone and the drain extension having a maximum net dopant concentration of $5 \times 10^{16}$–$5 \times 10^{17}$ atoms/cm$^3$ and reaching that maximum net dopant concentration of a depth of at least 0.05 µm into the semiconductive body; and a gate electrode situated above the channel zone, vertically separated from the channel zone by gate dielectric material, extending partially over both the drain extension and the main drain portion, and also extending partially over both the source zone and the threshold body zone.

6. A structure as in claim 5 wherein the drain extension substantially surrounds the main drain portion along its outside surface within the material of the semiconductive body.

7. A structure as in claim 5 wherein the threshold body zone substantially surrounds the source zone along its outside surface within the material of the semiconductive body.

8. A structure as in claim 5 wherein each of the source zone and the main drain portion has a maximum net dopant concentration of $5 \times 10^{19}$–$2 \times 10^{20}$ atoms/cm$^3$.

9. A structure as in claim 5 wherein the gate electrode has opposing source and drain side edges located respectively above the source and drain zones, the drain extension having a net dopant concentration which progressively decreases in moving laterally along the upper surface of the semiconductive body from a location below the drain side edge in a direction towards the source side edge.

10. A structure comprising:
a device region of a first conductivity type situated in a semiconductive body;
source and drain zones of a second conductivity type opposite to the first conductivity type situated in the semiconductive body along its upper surface and laterally separated by a channel zone of the device region, the drain zone comprising a main drain portion and a more lightly doped drain extension located between the channel zone and the main drain portion, the drain extension substantially extending at least as deep into the semiconductive body as the main drain portion, the channel zone comprising an output channel portion and a more heavily doped input channel portion that respectively meet the drain extension and the source zone, the input channel portion being part of a source-adjoining threshold body zone of the first conductivity type substantially extending at least as deep into the semiconductive body as the source zone, each of the threshold body zone and the drain extension reaching a maximum net dopant concentration at a depth of at least 0.05 µm into the semiconductive body; and a gate electrode situated above the channel zone, vertically separated from the channel zone by gate dielectric material, and extending over both the source zone and the threshold body zone.

11. A structure as in claim 10 wherein the drain extension substantially surrounds the main drain portion along its outside surface within the material of the semiconductive body.

12. A structure as in claim 10 wherein the threshold body zone substantially surrounds the source zone along its outside surface within the material of the semiconductive body.

13. A structure as in claim 10 wherein the gate electrode also extends over both the main drain portion and the drain extension.

14. A structure comprising:
a device region of a first conductivity type situated in a semiconductive body;
source and drain zones of a second conductivity type opposite to the first conductivity type situated in the semiconductive body along its upper surface and laterally separated by a channel zone of the device region, the drain zone comprising a main drain portion and a more lightly doped drain extension located between the channel zone and the main drain portion, the drain extension substantially extending at least as deep into the semiconductive body as the main drain portion, the channel zone comprising an output channel portion and a more heavily doped input channel portion that respectively meet the drain extension and the source zone, the input channel portion being part of a source-adjoining threshold body zone of the first conductivity type substantially extending at least as deep into the semiconductive body as the source zone, the threshold body zone substantially surrounding the source zone along its outside surface within the material of the semiconductive body; and a gate electrode situated above the channel zone, vertically separated from the channel zone by gate dielectric material, extending partially over both the drain extension and the main drain portion, and also extending partially over both the source zone and the threshold body zone, the threshold body zone reaching a maximum lateral distance under the gate electrode at a location below the upper surface of the semiconductive body.

15. A structure as in claim 14 wherein the drain extension substantially surrounds the main drain portion along its outside surface within the material of the semiconductive body.

16. A structure as in claim 14 wherein each of the threshold body zone and the drain extension has a maximum net dopant concentration of $5 \times 10^{16}$–$5 \times 10^{17}$ atoms/cm$^3$.

17. A structure as in claim 16 wherein each of the source zone and the main drain portion has a maximum net dopant concentration of $5 \times 10^{19}$–$2 \times 10^{20}$ atoms/cm$^3$.

18. A complementary transistor structure comprising:
a first device region of a first conductivity type situated in a semiconductive body;
first source and drain zones of a second conductivity type opposite to the first conductivity type situated in the semiconductive body along its upper surface and laterally separated by a first channel zone of the first device region, the first drain zone comprising a first main drain portion and a more lightly doped first drain extension located between the first channel zone and the first main drain portion, the first channel zone comprising a first output channel portion and a more heavily doped first input channel portion that respectively meet the first drain extension and the first source zone;
a first gate electrode situated above the first channel zone and vertically separated from it by gate dielectric material:
a second device region of the second conductivity type situated in the semiconductive body;

second source and drain zones of the first conductivity type situated in the semiconductive body along its upper surface and laterally separated by a second channel zone of the second device region, the second drain zone comprising a second main drain portion and a more lightly doped second drain extension located between the second channel zone and the second main drain portion, the second channel zone comprising a second output channel portion and a more heavily doped second input channel portion that respectively meet the second drain extension and the second source zone, the first input channel portion being part of a first source-adjoining threshold body zone of the first conductivity type extending approximately as deep into the semiconductive body as the second drain extension, the second input channel portion being part of a second source-adjoining threshold body zone of the second conductivity type extending approximately as deep into the semiconductive body as the first drain extension, the first and second threshold body zones respectively substantially surrounding the first and second source zones along their outside surfaces within the material of the semiconductive body; and a second gate electrode situated above the second channel zone and vertically separated from it by gate dielectric material.

19. A structure as in claim 18 wherein the first and second drain extensions substantially extend at least as deep into the semiconductive body respectively as the first and second main drain portions.

20. A structure as in claim 18 wherein:

the first gate electrode comprises non-monocrystalline semiconductive material of the second conductivity type; and the second gate electrode comprises non-monocrystalline semiconductive material of the first conductivity type.

21. A structure as in claim 18 wherein the first and second drain extensions respectively substantially surround the first and second main drain portions along their outside surfaces within the material of the semiconductive body.

22. A structure as in claim 18 wherein each of the threshold body zones and the drain extensions reaches a maximum net dopant concentration at a depth of no more than 0.05 µm into the semiconductive body.

23. A structure as in claim 18 wherein each of the threshold body zones and the drain extensions reaches a maximum net dopant concentration at a depth of at least 0.05 µm into the semiconductive body.

24. A structure comprising:

a device region of a first conductivity type situated in a semiconductive body;

source and drain zones of a second conductivity type opposite to the first conductivity type situated in the semiconductive body along its upper surface and laterally separated by a channel zone of the device region, the drain zone comprising a main drain portion and a more lightly doped drain extension located between the channel zone and the main drain portion, the drain extension substantially extending at least as deep into the semiconductive body as the main drain portion, the channel zone comprising an output channel portion and a more heavily doped input channel portion that respectively meet the drain extension and the source zone, the input channel portion being part of a source-adjoining threshold body zone of the first conductivity type substantially extending at least as deep into the semi-conductive body as the source zone, each of the threshold body zone and the drain extension having a maximum net dopant concentration of $5 \times 10^{16}$–$5 \times 10^{17}$ atoms/cm$^3$; and a gate electrode situated above the channel zone, vertically separated from the channel zone by gate dielectric material, extending partially over both the drain extension and the main drain portion, and also extending partially over both the source zone and the threshold body zone, the gate electrode having opposing source and drain side edges located respectively above the source and drain zones, the drain extension having a net dopant concentration which progressively decreases in moving laterally along the upper surface of the semiconductive body from a location below the drain side edge in a direction towards the source side edge.

25. A structure as in claim 24 wherein the drain extension substantially surrounds the main drain portion along its outside surface within the material of the semiconductive body.

26. A structure as in claim 24 wherein the threshold body zone substantially surrounds the source zone along its outside surface within the material of the semiconductive body.

27. A structure as in claim 24 wherein each of the source zone and the main drain portion has a maximum net dopant concentration of $5 \times 10^{19}$–$2 \times 10^{20}$ atoms/cm$^3$.

28. A complementary transistor structure comprising:

a first device region of a first conductivity type situated in a semiconductive body;

first source and drain zones of a second conductivity type opposite to the first conductivity type situated in the semiconductive body along its upper surface and laterally separated by a first channel zone of the first device region, the first drain zone comprising a first main drain portion and a more lightly doped first drain extension located between the first channel zone and the first main drain portion, the first channel zone comprising a first output channel portion and a more heavily doped first input channel portion that respectively meet the first drain extension and the first source zone;

a first gate electrode situated above the first channel zone and vertically separated from it by gate dielectric material;

a second device region of the second conductivity type situated in the semiconductive body;

second source and drain zones of the first conductivity type situated in the semiconductive body along its upper surface and laterally separated by a second channel zone of the second device region, the second drain zone comprising a second main drain portion and a more lightly doped second drain extension located between the second channel zone and the second main drain portion, the second channel zone comprising a second output channel portion and a more heavily doped second input channel portion that respectively meet the second drain extension and the second source zone, the first input channel portion being part of a first source-adjoining threshold body zone of the first conductivity type extending approximately as deep into the semiconductive body as the second drain extension, the second input channel portion being part of a second source-adjoining, threshold body zone of the second conductivity type extending approximately as deep into the semiconductive body as the first drain extension, each of the threshold body zones and the drain extensions reaching a maximum net dopant concentration at a depth of at least 0.05 μm into the semiconductive body; and a second gate electrode situated above the second channel zone and vertically separated from it by bate dielectric material.

29. A structure as in claim 28 wherein the first and second drain extensions substantially extend at least as deep into the semiconductive body respectively as the first and second main drain portions.

30. A structure as in claim 28 wherein:

the first gate electrode comprises non-monocrystalline semiconductive material of the second conductivity type; and the second gate electrode comprises non-monocrystalline semiconductive material of the first conductivity type.

* * * * *